(12) United States Patent
Igarashi

(10) Patent No.: US 7,083,864 B2
(45) Date of Patent: Aug. 1, 2006

(54) AROMATIC CONDENSED-RING COMPOUND, LIGHT EMITTING DEVICE MATERIAL AND LIGHT EMITTING DEVICE USING THE SAME

(75) Inventor: Tatsuya Igarashi, Kanagawa (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 140 days.

(21) Appl. No.: 10/647,353

(22) Filed: Aug. 26, 2003

(65) Prior Publication Data

US 2004/0048102 A1 Mar. 11, 2004

Related U.S. Application Data

(62) Division of application No. 09/695,978, filed on Oct. 26, 2000, now Pat. No. 6,635,364.

(30) Foreign Application Priority Data

Oct. 26, 1999 (JP) ................................. 11-304206
Sep. 25, 2000 (JP) ............................. 2000-290626

(51) Int. Cl.
*H01L 51/54* (2006.01)
*H05B 33/14* (2006.01)
(52) U.S. Cl. ..................... 428/690; 428/917; 313/504; 313/506; 257/E51.049
(58) Field of Classification Search ............... 428/690, 428/917; 313/504, 506; 252/301.16
See application file for complete search history.

(56) References Cited

U.S. PATENT DOCUMENTS

| | | | |
|---|---|---|---|
| 5,077,142 A | 12/1991 | Sakon et al. ................. 428/690 |
| 5,935,721 A | 8/1999 | Shi et al. .................... 428/690 |
| 5,972,247 A | 10/1999 | Shi et al. .................... 252/583 |
| 6,352,791 B1 * | 3/2002 | Fink et al. ................... 428/690 |
| 6,387,547 B1 | 5/2002 | Fujita et al. ................. 428/690 |
| 6,399,223 B1 | 6/2002 | Fujita et al. ................. 428/690 |
| 6,437,123 B1 * | 8/2002 | Bock et al. .................. 544/216 |
| 6,656,608 B1 * | 12/2003 | Kita et al. ................... 428/690 |

FOREIGN PATENT DOCUMENTS

| | | |
|---|---|---|
| EP | 0952200 A2 | 10/1999 |
| EP | 1013740 A2 | 6/2000 |
| JP | 8-302341 A | 11/1996 |
| JP | 10-088122 A | 4/1998 |
| JP | 11-212588 A2 | 8/1999 |
| JP | 2000-26337 A | 1/2000 |

OTHER PUBLICATIONS

European Search Report dated Nov. 19, 2001.
XP-002181637, M. John Plater, Fullerene Tectonics. Part 1. A Programmed precursor to $C_{60}$, J. Chem. Soc., Perkin Trans. 1, 1997, pp. 2897-2901.

* cited by examiner

*Primary Examiner*—Marie Yamnitzky
(74) *Attorney, Agent, or Firm*—Sughrue Mion, PLLC

(57) ABSTRACT

A light emitting device material comprising a compound represented by the following formula (1):

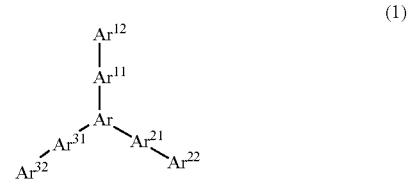

(1)

wherein $Ar^{11}$, $Ar^{12}$ and $Ar^{31}$ each represent an arylene group, $Ar^{12}$, $Ar^{22}$ and $Ar^{32}$ each represent a substituent group or a hydrogen atom, provided that at least one among $Ar^{11}$, $Ar^{21}$, $Ar^{31}$, $Ar^{12}$, $Ar^{22}$ and $Ar^{32}$ has a condensed-ring arene or heteroarene structure, and Ar represents a trivalent arene or heteroarene group.

14 Claims, No Drawings

AROMATIC CONDENSED-RING COMPOUND, LIGHT EMITTING DEVICE MATERIAL AND LIGHT EMITTING DEVICE USING THE SAME

CROSS REFERENCE TO RELATED APPLICATION

This is a Divisional Application of pending prior application Ser. No. 09/695,978 filed Oct. 26, 2000, now U.S. Pat. No. 6,635,364; the disclosure of which is incorporated herein by reference.

FIELD OF THE INVENTION

The present invention relates to an aromatic condensed-ring compound, a material used for light emitting devices capable of luminescing through conversion of electric energy into light, and a light emitting device using such a material. In particular, the invention is concerned with a light emitting device suitably used in the areas of indicators, displays, backlight, electrophotography, illumination sources, recording light sources, exposure illuminants, reading light sources, beacons, signboards and interiors.

BACKGROUND OF THE INVENTION

Nowadays, lively researches and developments in various display devices are being made. Of such devices, the organic electric-field luminescent (EL) devices are receiving particular attention as promising display devices because they can emit light of high intensity under low voltage. For instance, the Light emitting devices having organic thin films formed by vapor deposition of organic compounds are known (Applied Physics Letters, 51, p. 913 (1987). The organic Light emitting devices described in the literature cited above employ tris (8-hydroxyquinolinato) aluminum complex (Alq) as an electron transporting material and is structured to superimpose a layer of positive hole transporting material (an amine compound) on the layer of electron transporting material, and thereby show substantial improvements in their luminescent (light emitting) characteristics over conventional single-layer devices.

In recent years, the application of organic EL devices to full-color display has been examined actively. In order to develop high-performance full-color display, it is necessary to improve on the characteristics of conventional blue, green and red light emitting devices respectively. As to the blue light emitting devices, for instance, the distyrylarylene compounds (DPVBi) described in a book entitled "Organic EL devices and Forefront of Industrialization thereof", at page 38 (published by NTS Co.) have been studied extensively, but they have problems with color purity, durability, luminous intensity and efficiency, and so further improvements in these characteristics have been expected.

Although the organic light emitting devices comprising organic materials laminated by vacuum evaporation have really succeeded in luminescence (light emitting) of high luminance, the use of coating methods for manufacturing devices have advantages over that of vacuum evaporation methods from the viewpoints of simplicity of the manufacturing process, workability and ease in achievement of large-area luminescence. However, the devices, especially blue light emitting devices, manufactured according to conventional coating methods are inferior to those manufactured using vapor deposition methods in luminous intensity and luminous efficiency. Therefore, the development of novel blue luminescent materials has been awaited.

SUMMARY OF THE INVENTION

An object of the invention is to provide a light emitting device having satisfactory luminescence (light emitting) characteristics and durability, and a material enabling a light emitting device to have such characteristics.

The object is attained with the following means.

1. A light emitting device material comprising a compound represented by the following formula (1):

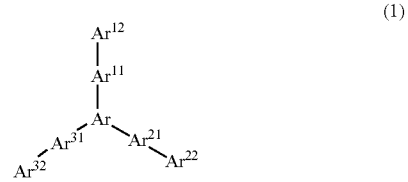

wherein $Ar^{11}$, $Ar^{21}$ and $Ar^{31}$ each represent an arylene group, $Ar^{12}$, $Ar^{22}$ and $Ar^{32}$ each represent a substituent group or a hydrogen atom, provided that at least one of $Ar^{11}$, $Ar^{21}$, $Ar^{31}$, $Ar^{12}$, $Ar^{22}$ and $Ar^{32}$ has a phenanthrene structure or a condensed-ring aryl structure having at least four rings, and Ar represents a trivalent arene or heteroarene group.

2. A light emitting device material comprising a compound represented by the following formula (2):

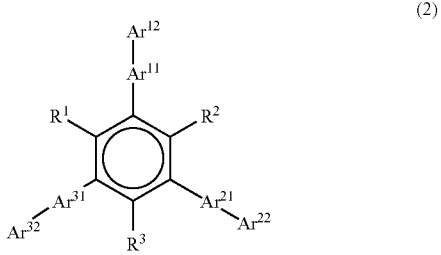

wherein $Ar^{11}$, $Ar^{21}$ and $Ar^{31}$ each represents an arylene group, $Ar^{12}$, $Ar^{22}$ and $Ar^{32}$ each represents a substituent group or a hydrogen atom, provided that at least one of $Ar^{11}$, $Ar^{21}$, $Ar^{31}$, $Ar^{12}$, $Ar^{22}$ and $Ar^{32}$ has a phenanthrene structure or a condensed-ring aryl structure having at least four rings, and $R^1$, $R^2$ and $R^3$ each represents a hydrogen or a substituent.

3. A light emitting device material as described in item 1 or 2, wherein at least one of $Ar^{11}$, $Ar^{21}$, $Ar^{31}$, $Ar^{12}$, $Ar^{22}$ and $Ar^{32}$ has a condensed-ring aryl structure having at least four rings.

4. A light emitting device material as described in item 1, 2 or 3, wherein $Ar^{11}$, $Ar^{21}$ and $Ar^{31}$ each represents a phenanthrenylene group or a condensed-ring arylene group having at least four rings.

5. A light emitting device material comprising a compound represented by formula (1a):

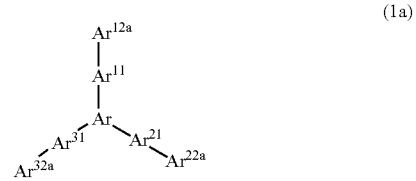

wherein $Ar^{11}$, $Ar^{21}$ and $Ar^{31}$ each represents an arylene group, $Ar^{12a}$, $Ar^{22a}$ and $Ar^{32a}$ each represents a condensed-ring aryl group, and Ar represents a trivalent arene or heteroarene group.

6. A light emitting device material as described in item 5, wherein $Ar^{12a}$, $Ar^{22a}$ and $Ar^{32a}$ each represents a condensed-ring aryl group having at least three rings.

7. A light emitting device material comprising a compound represented by formula (2a):

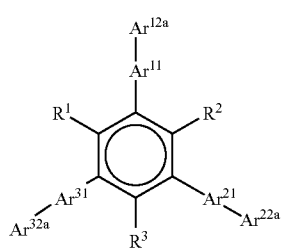

(2a)

wherein $Ar^{11}$, $Ar^{21}$ and $Ar^{31}$ each represents an arylene group, $Ar^{12a}$, $Ar^{22a}$ and $Ar^{32a}$ each represents a condensed-ring aryl group, and $R^1$, $R^2$ and $R^3$ each represents a hydrogen or a substituent.

8. A light emitting device material as described in item 1, 2, 3 or 4, wherein $Ar^{12}$, $Ar^{22}$ and $Ar^{32}$ each represents a phenathrene group or a condensed ring aryl group having at least four rings.

9. A light emitting device material as described in item 1, 2, 3, 4, 5, 6, 7 or 8, wherein the compound represented by formula (1) consists of carbon atoms and hydrogen atoms.

10. A compound represented by the following formula (3):

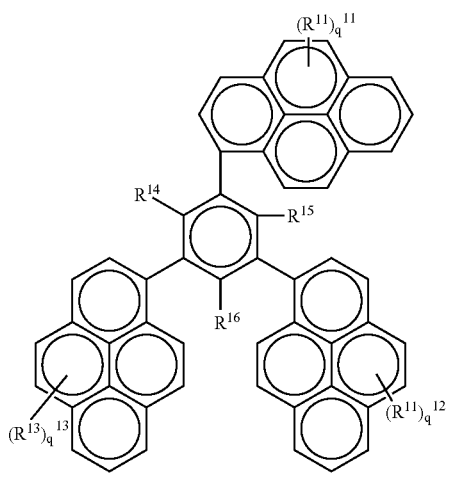

(3)

wherein $R^{11}$, $R^{12}$ and $R^{13}$ each represents a substituent group, $R^{14}$, $R^{15}$ and $R^{16}$ each represents a hydrogen atom or a substituent, and $q^{11}$, $q^{12}$ and $q^{13}$ each represents an integer of 0 to 9.

11. A light emitting device material comprising a compound of formula (3) defined in claim 10.

12. A compound represented by the following formula (4):

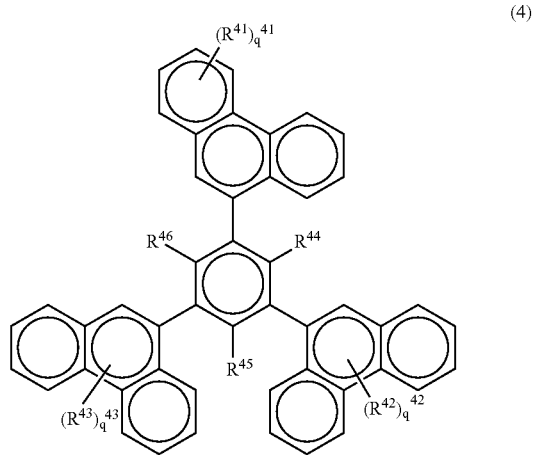

(4)

wherein $R^{41}$, $R^{42}$ and $R^{43}$ each represents a substituent group, $R^{44}$, $R^{45}$ and $R^{46}$ each represents a hydrogen atoms or a substituent group, and $q^{41}$, $q^{42}$ and $q^{43}$ each represents an integer of 0 to 9.

13. A light emitting device material comprising a compound of formula (4) defined in item 12.

14. A compound represented by the following formula (5):

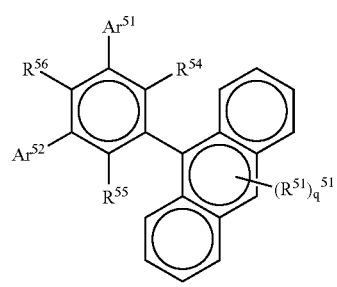

(5)

wherein $R^{51}$ represents a substituent, $R^{54}$, $R^{55}$ and $R^{56}$ each represents a hydrogen atoms or a substituent group, $Ar^{51}$ represents an anthryl group, a phenanthryl group or a pyrenyl group, $Ar^{52}$ represents a phenanthryl group or a pyrenyl group, and $q^{51}$ each represents an integer of 0 to 9.

15. A light emitting device material comprising a compound of formula (5) defined in item 14.

16. A compound represented by the following formula (6):

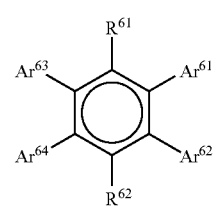

(6)

wherein $R^{61}$ and $R^{62}$ represents a substituent, and $Ar^{61}$, $Ar^{62}$, $Ar^{63}$ and $Ar^{64}$ each represents a condensed-ring aryl group.

17. A compound represented by the following formula (7):

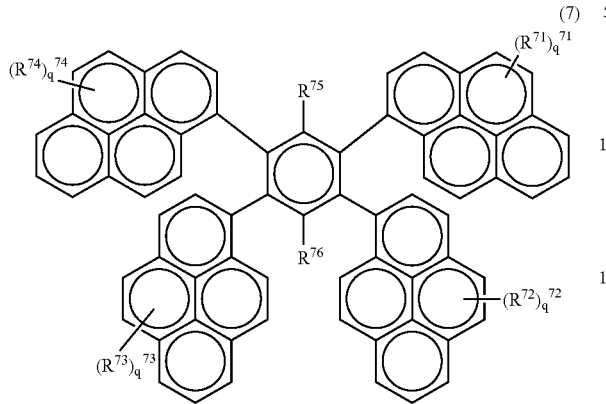

wherein $R^{71}$, $R^{72}$, $R^{73}$ and $R^{74}$ represents a substituent, $R^{75}$ and $R^{76}$ each represents a hydrogen atom or a substituent, and $q^{71}$, $q^{72}$ $q^{73}$ and $q^{74}$ each represents an integer of 0 to 9.

18. A light emitting device material comprising a compound of formula (7) defined in item 17.

19. A compound represented by the following formula (8):

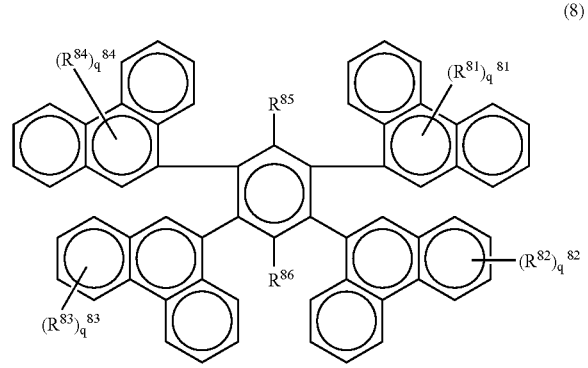

wherein $R^{81}$, $R^{82}$, $R^{83}$ and $R^{84}$ represents a substituent, $R^{85}$ and $R^{86}$ each represents a hydrogen atom or a substituent, and $q^{81}$, $q^{82}$, $q^{83}$ and $q^{84}$ each represents an integer of 0 to 9.

20. A light emitting device material comprising a compound of formula (8) defined in item 19.

21. A light emitting device comprising a pair of electrodes and one of a luminescent layer and a plurality of thin organic compound layers including a luminescent layer, wherein at least one layer is a layer comprising at least one light emitting device material as described in item 1, 2, 3, 4, 5, 6, 7, 8, 11, 13, 15, 18 or 20.

22. An organic light emitting device as described in item 21, wherein the layer comprising a light emitting device material as described in item 1, 2, 3, 4, 5, 6, 7, 8, 11, 13, 15, 18 or 20 is a layer formed in a coating process.

DETAILED DESCRIPTION OF THE INVENTION

The invention is described below in detail.

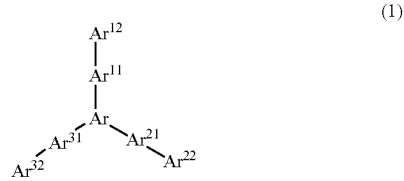

The formula (1) representing compounds according to the invention are illustrated first.

$Ar^{11}$, $Ar^{21}$ and $Ar^{31}$ each represent an arylene group. The suitable number of carbon atoms contained in the arylene group is from 6 to 30, preferably from 6 to 20, and particularly preferably from 6 to 16. Examples of such an arylene group include a phenylene group, a naphthylene group, an anthrylene group, a phenanthrenylene group, a pyrenylene group, a perylenylene group, a fluorenylene group, a biphenylene group, a terphenylene group, a rubrenylene group, a chrysenylene group, a triphenylene group, a benzanthrylene group, a benzophenanthrenylene group and a diphenylanthrylene group. These arylene groups each may have a substituent group.

Examples of a substituent group on an arylene group include alkyl groups (containing preferably 1 to 30 carbon atoms, more preferably 1 to 20 carbon atoms, particularly preferably 1 to 10 carbon atoms, such as methyl, ethyl, iso-propyl, tert-butyl, n-octyl, n-decyl, n-hexadecyl, cyclopropyl, cyclopentyl and cyclohexyl groups), alkenyl groups (containing preferably 2 to 30 carbon atoms, more preferably 2 to 20 carbon atoms, particularly preferably 2 to 10 carbon atoms, such as vinyl, allyl, 2-butenyl and 3-pentenyl groups), alkynyl groups (containing preferably 2 to 30 carbon atoms, more preferably 2 to 20 carbon atoms, particularly preferably 2 to 10 carbon atoms, such as propargyl and 3-pentynyl groups), aryl groups (containing preferably 6 to 30 carbon atoms, more preferably 6 to 20 carbon atoms, particularly preferably 6 to 12 carbon atoms, such as phenyl, p-methylphenyl, naphthyl and anthranyl groups), amino groups (containing preferably 0 to 30 carbon atoms, more preferably 0 to 20 carbon atoms, particularly preferably 0 to 10 carbon atoms, such as amino, methylamino, dimethylamino, diethylamino, dibenzylamino, diphenylamino and ditolylamino groups), alkoxy groups (containing preferably 1 to 30 carbon atoms, more preferably 1 to 20 carbon atoms, particularly preferably 1 to 10 carbon atoms, such as methoxy, ethoxy, butoxy and 2-ethylhexyloxy groups), aryloxy groups (containing preferably 6 to 30 carbon atoms, more preferably 6 to 20 carbon atoms, particularly preferably 6 to 12 carbon atoms, such as phenyloxy, 1-naphthyloxy and 2-naphthyloxy groups), heteroaryloxy groups (containing preferably 1 to 30 carbon atoms, more preferably 1 to 20 carbon atoms, particularly preferably 1 to 12 carbon atoms, such as pyridyloxy, pyrazyloxy, pyrimidyloxy and quinolyloxy groups), acyl groups (containing preferably 1 to 30 carbon atoms, more preferably 1 to 20 carbon atoms, particularly preferably 1 to 12 carbon atoms, such as acetyl, benzoyl, formyl and pivaroyl groups), alkoxycarbonyl groups (containing preferably 2 to 30 carbon atoms, more preferably 2 to 20 carbon atoms, particularly preferably 2 to 12 carbon atoms, such as methoxycarbonyl and ethoxycarbonyl groups), aryloxycarbonyl groups (containing preferably 7 to 30 carbon atoms, more preferably 7 to 20 carbon atoms, particularly preferably 7 to 12 carbon atoms, such as phenyloxycarbonyl group), acyloxy groups (containing preferably 2 to 30 carbon atoms, more preferably 2 to 20 carbon atoms, particularly preferably 2 to 10 carbon atoms, such as acetoxy and benzoyloxy groups), acylamino groups (containing preferably 2 to 30 carbon atoms, more preferably 2 to 20 carbon atoms, particularly preferably 2 to 10 carbon atoms, such as acetylamino and benzxoylamino groups), alkoxycarbonylamino groups (containing preferably 2 to 30 carbon atoms, more preferably 2 to 20 carbon atoms, particularly preferably 2 to 12 carbon atoms, such as methoxycarbonylamino group), aryloxycarbonylamino groups (containing preferably 7 to 30 carbon atoms, more preferably 7 to 20 carbon atoms, particularly preferably 7 to 12 carbon atoms, such as phenyloxycarbonylamino group), sulfonylamino groups (containing preferably 1 to 30 carbon atoms, more preferably 1 to 20 carbon atoms, particularly preferably 1 to 12 carbon atoms, such as methanesulfonylamino and benzenesulfonylamino groups), sulfamoyl groups (containing preferably 0 to 30 carbon atoms, more preferably 0 to 20 carbon atoms, particularly preferably 0 to 12 carbon atoms, such as sulfamoyl, methylsulfamoyl, dimethylsulfamoyl and phenylsulfamoyl groups), carbamoyl groups (containing preferably 1 to 30 carbon atoms, more preferably 1 to 20 carbon atoms, particularly preferably 1 to 12 carbon atoms, such as carbamoyl, methylcarbamoyl, diethylcarbamoyl and phenylcarbamoyl groups), alkylthio groups (containing preferably 1 to 30 carbon atoms, more preferably 1 to 20 carbon atoms, particularly preferably 1 to 12 carbon atoms, such as methylthio and ethylthio groups), arylthio groups (containing preferably 6 to 30 carbon atoms, more preferably 6 to 20 carbon atoms, particularly preferably 6 to 12 carbon atoms, such as phenylthio group), heteroarylthio groups (containing preferably 1 to 30 carbon atoms, more preferably 1 to 20 carbon atoms, particularly preferably 1 to 12 carbon atoms, such as pyridylthio, 2-benzimidazolylthio, 2-benzoxazolylthio and 2-benzothiazolylthio groups), sulfonyl groups (containing preferably 1 to 30 carbon atoms, more preferably 1 to 20 carbon atoms, particularly preferably 1 to 12 carbon atoms, such as mesyl and tosyl groups), sulfinyl groups (containing preferably 1 to 30 carbon atoms, more preferably 1 to 20 carbon atoms, particularly preferably 1 to 12 carbon atoms, such as methanesulfinyl and benzenesulfinyl groups), ureido groups (containing preferably 1 to 30 carbon atoms, more preferably 1 to 20 carbon atoms, particularly preferably 1 to 12 carbon atoms, such as ureido, methylureido and phenylureido groups), phosphoric acid amido groups (containing preferably 1 to 30 carbon atoms, more preferably 1 to 20 carbon atoms, particularly preferably 1 to 12 carbon atoms, such as diethylphosphoric acid amido and phenylphosphoric acid amido groups), a hydroxyl group, a mercapto group, halogen atoms (such as fluorine, chlorine, bromine and iodine atoms), a cyano group, a sulfo group, a carboxyl group, a nitro group, a hydroxamic acid group, an imino group, heterocyclic groups (containing preferably 1 to 30 carbon atoms, more preferably 1 to 12 carbon atoms, and nitrogen, oxygen or/and sulfur atoms as hetero atoms, such as imidazolyl, pyridyl, quinolyl, furyl, thienyl, piperidyl, morpholino, benzoxazolyl, benzimidazolyl, benzothiazolyl, carbazolyl and azepinyl groups) and silyl groups (containing preferably 3 to 40 carbon atoms, more preferably 3 to 30 carbon atoms, particularly preferably 3 to 24 carbon atoms, such as trimethylsilyl and triphenylsilyl groups). The substituent groups as recited above may further be substituted.

Of the arylene groups as recited above, those preferred as each of $Ar^{11}$, $Ar^{21}$ and $Ar^{31}$ are phenylene group, naphthylene group, anthrylene group, phenanthrenylene group, biphenylene group, and arylene group having at least four rings (e.g., pyrenylene, perylenylene). Of these groups, phenylene group, naphthylene group, phenanthrenylene group and arylene group having at least four rings are more preferred. Further, phenylene, phenanthrenylene and pyrenylene groups, especially pyrenylene group, are advantageous.

$Ar^{12}$, $Ar^{22}$ and $Ar^{32}$ each represent a substituent group or a hydrogen atom. Examples of such a substituent group include the groups recited above as substituent groups with which $Ar^{11}$ may be substituted. Preferably, $Ar^{12}$, $Ar^{22}$ and $Ar^{32}$ are each a hydrogen atom, an aryl group, a heteroaryl group, an alkyl group or an alkenyl group. Of these groups, a hydrogen atom, an aryl group and a heteroaryl group are preferred over the others. Further, it is advantageous for each of $Ar^{12}$, $Ar^{22}$ and $Ar^{32}$ to be a hydrogen atom or an aryl group, especially a hydrogen atom or a pyrenyl group.

However, at least one among $Ar^{11}$, $Ar^{21}$, $Ar^{31}$, $Ar^{12}$, $Ar^{22}$ and $Ar^{32}$ is required to have a phenanthrene structure or a condensed-ring aryl structure having at least four rings, preferably phenanthrene, pyrene and perylene structures, more preferably pyrene and phenanthrene structures, further preferably a pyrene structure.

Ar represents a trivalent arene group (containing preferably 6 to 30, more preferably 6 to 20, particularly preferably 6 to 16, carbon atoms, such as a trivalent benzene, naphthalene, anthracene, phenanthrene, pyrene or terphenyl group), or a trivalent heteroarene group (containing as a hetero atom preferably a nitrogen, sulfur or oxygen atom, more preferably a nitrogen atom, and further containing preferably 2 to 30, more preferably 3 to 20, particularly preferably 3 to 16, carbon atoms, such as a trivalent pyridine, pyrazine, thiophene, quinoline, quinoxaline or triazine group). Each of these groups may have a substituent group. Examples of such a substituent group include the groups recited above as substituent groups $Ar^{11}$ may have. The group preferred as Ar is a trivalent group of benzene, naphthalene, anthracene, pyrene or terphenyl. In particular, it is advantageous for Ar to be a trivalent group of benzene, which preferably has no substituent groups, except $Ar^{11}$, $Ar^{21}$ and $Ar^{31}$, or a trivalent group of alkyl-substituted benzene.

It is preferable for the compound of formula (1) to take a form represented by formula (2) or (6), more preferably formula (3), (4), (5), (7) or (8), further preferably formula (3). The present compound preferably consists of carbon atoms and hydrogen atoms.

(2)

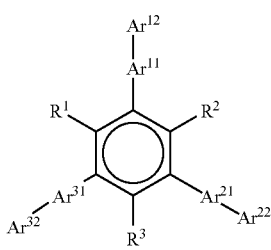

-continued (3)

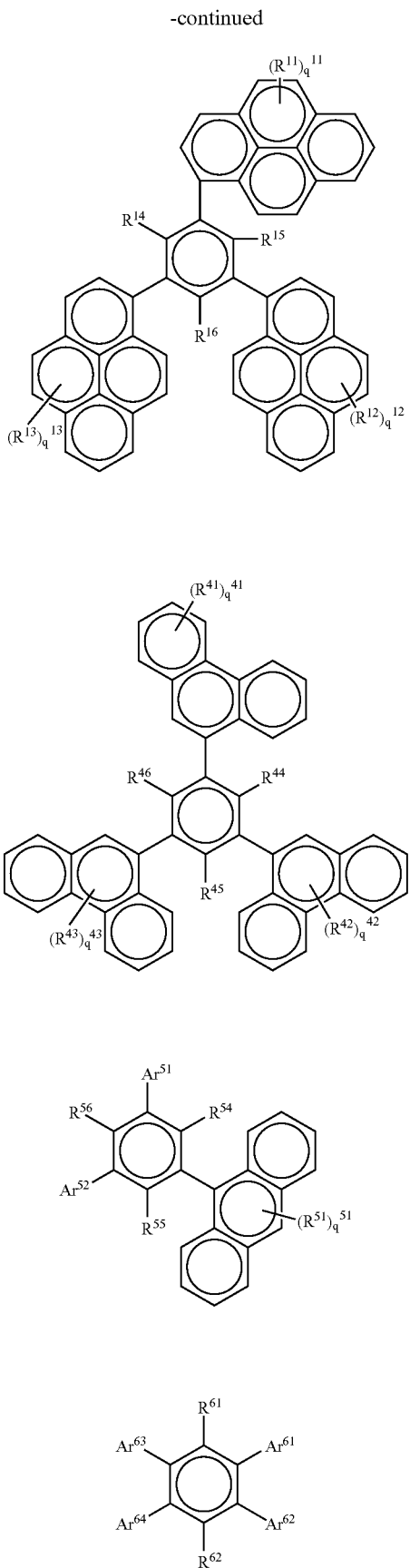

(4)

(5)

(6)

-continued (7)

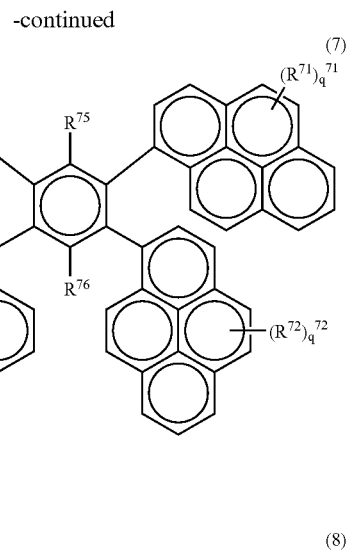

(8)

Formula (2) is explained below. $Ar^{11}$, $Ar^{21}$, $Ar^{31}$, $Ar^{12}$ $Ar^{22}$ and $Ar^{32}$ in formula (2) have the same meanings as $Ar^{11}$, $Ar^{21}$, $Ar^{31}$, $Ar^{12}$, $Ar^{22}$ and $Ar^{32}$ in formula (1) respectively. $R^1$, $R^2$ and $R^3$ each represents a hydrogen or a substituent. Examples of such a substituent group include the groups recited hereinbefore as substituents which may be present on $Ar^{11}$. $R^1$, $R^2$ and $R^3$ each preferably represents a hydrogen, an aklyl group or an aryl group, more preferably a hydrogen or an alkyl group.

The compounds preferred as compounds represented by formula (1) or (2) are compounds in which at least one among $Ar^{11}$, $Ar^{21}$, $Ar^{31}$, $Ar^{12}$, $Ar^{22}$ and $Ar^{32}$ has a phenanthrene structure or a condensed-ring structure having at least four rings, more preferably a phenanthrene structure or pyrene structure. The compounds represented by formula (1) or (2) are preferably compounds wherein $Ar^{12}$, $Ar^{22}$ and $Ar^{32}$ each represents a condensed-ring aryl group or a hydrogen atom, more preferably a condensed-ring aryl group having at least three rings or a hydrogen atom, further preferably a phenanthrene structure, a condensed-ring aryl structure having at least four rings or a hydrogen atom. The compounds represented by formula (1) or (2) are preferably compounds wherein $Ar^{11}$, $Ar^{21}$ and $Ar^{31}$ each represents a phenanthrenylene group or a condensed-ring arylene having at least four rings.

Furthermore, it is advantageous for the compounds represented by formula (1) or (2) to be constituted of carbon and hydrogen atoms alone.

Formulas (1a) and (2a) are explained below. Ar, $Ar^{11}$, $Ar^{21}$, $Ar^{31}$, $R^1$, $R^2$ and $R^3$ in formulas (1a) and (2a) have the same meanings as those in formulas (1) and (2), respectively. Also, their preferred scopes are the same as those in formulas (1) and (2).

Examples of the condensed-ring aryl group represented by $Ar^{12a}$, $Ar^{22a}$ and $Ar^{32a}$ include a naphthylene group, an anthrylene group, a phenanthrenylene group, a pyrenylene group, a perylenylene group, a fluorenylene group, a biphenylene group, a terphenylene group, a rubrenylene group, a chrysenylene group, a triphenylene group, a benzanthrylene group, a benzophenanthrenylene group and a diphenylanthracenylene group. These groups may further have a substituent group as explained in the substituent group for the arylene group of $Ar^{11}$ to $Ar^{31}$.

Formula (3) is explained below. In formula (3), $R^{11}$, $R^{12}$ and $R^{13}$ each represent a substituent group. Examples of such a substituent group include the groups recited hereinbefore as substituents which may be present on $Ar^{11}$. The groups preferred as $R^{11}$, $R^{12}$ and $R^{13}$ include alkyl, alkenyl, aryl, heteroaryl and alkoxy groups. Of these groups, alkyl and aryl groups, especially aryl groups, are advantageous.

$q^{11}$, $q^{12}$ and $q^{13}$ are each an integer of 0 to 9, preferably an integer of 0 to 3, more preferably an integer of 0 to 2, particularly preferably 0 or 1.

Formula (4) is explained below. $R^{41}$, $R^{42}$ and $R^{43}$ each has the same meaning as $R^1$ mentioned above, and their preferred scopes are the same as that of $R^1$. $q^{41}$, $q^{42}$ and $q^{43}$ are each an integer of 0 to 9, preferably an integer of 0 to 3, more preferably an integer of 0 to 2, particularly preferably 0 or 1.

Formula (5) is explained below. $R^{51}$ has the same meaning as $R^{11}$ mentioned above, and its preferred scope is the same as that of $R^{11}$. $R^{54}$, $R^{55}$ and $R^{56}$ each has the same meaning as $R^1$ mentioned above, and its preferred scope is the same as that of $R^1$. $Ar^{51}$ represents an anthryl group, a phenanthryl group or a pyrenyl group. $Ar^{52}$ represents a phenanthryl group or a pyrenyl group. $Ar^{51}$ is preferably a phenanthryl group or a pyrenyl group. $Ar^{52}$ is preferably a pyrenyl group. $q^{51}$ represents an integer of 0 to 9, preferably an integer of 0 to 3, more preferably an integer of 0 to 2, particularly preferably 0 or 1.

Formula (6) is explained below. $R^{61}$ and $R^{62}$ each has the same meaning as $R^1$ mentioned above, and its preferred scope is the same as that of $R^1$. $Ar^{61}$, $Ar^{62}$, $Ar^{63}$ and $Ar^{64}$ each represents a condensed-ring aryl group, preferably a phenanthryl group or an aryl group having at least four rings, more preferably a phenanthryl group or a pyrenyl group.

Formula (7) is explained below. $R^{71}$, $R^{72}$, $R^{73}$ and $R^{74}$ each has the same meaning as $R^{11}$ mentioned above, and its preferred scope is the same as that of $R^{11}$. $R^{75}$ and $R^{76}$ each has the same meaning as $R^1$ mentioned above, and its preferred scope is the same as that of $R^1$. $q^{71}$, $q^{72}$, $q^{73}$ and $q^{74}$ are each an integer of 0 to 9, preferably an integer of 0 to 3, more preferably an integer of 0 to 2, particularly preferably 0 or 1.

Formula (8) is explained below. $R^{81}$, $R^{82}$, $R^{83}$ and $R^{84}$ each has the same meaning as $R^{11}$ mentioned above, and its preferred scope is the same as that of $R^{11}$. $R^{85}$ and $R^{86}$ each has the same meaning as $R^1$ mentioned above, and its preferred scope is the same as that of $R^1$. $q^{81}$, $q^{82}$, $q^{83}$ and $q^{84}$ are each an integer of 0 to 9, preferably an integer of 0 to 3, more preferably an integer of 0 to 2, particularly preferably 0 or 1.

The present compound may be a low molecular compound, or a oligomer or polymer compound (weight average molecular weight of which is preferably from 1,000 to 5,000,000, more preferably from 2,000 to 1,000,000, particularly preferably from 3,000 to 100,000, on a polystyrene basis). In the case of a polymer compound, the structure represented by formulas (1) to (8) may be present in the main chain or side chains of the polymer. And the polymer compound may be a homopolymer or copolymer compound. However, the present compound is preferably a low molecular compound.

Moreover, it is advantageous that the present compound shows the λmax of its fluorescent spectrum (maximum luminescent wavelength) in the region of 400 to 500 nm, preferably 400 to 480 nm, particularly preferably 400 to 460 nm.

Examples of the present compounds are illustrated below, but these examples should not be construed as limiting the scope of the invention in any way.

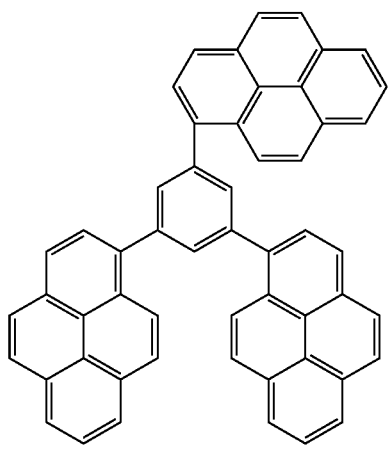

(1-1)

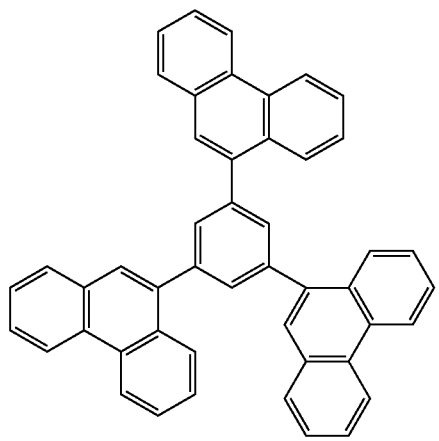

(1-2)

-continued
(1-6)
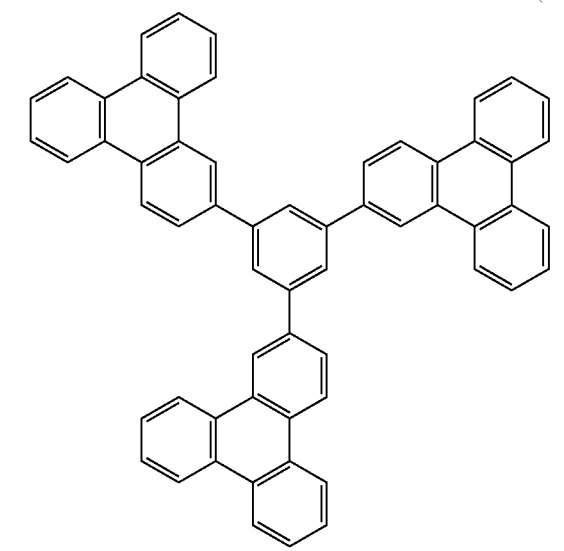
(1-9)
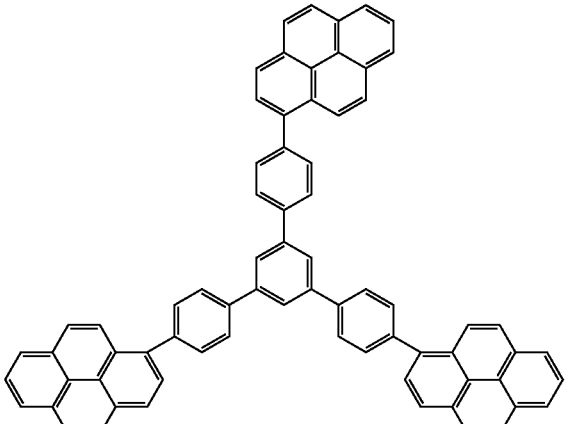
(1-7)
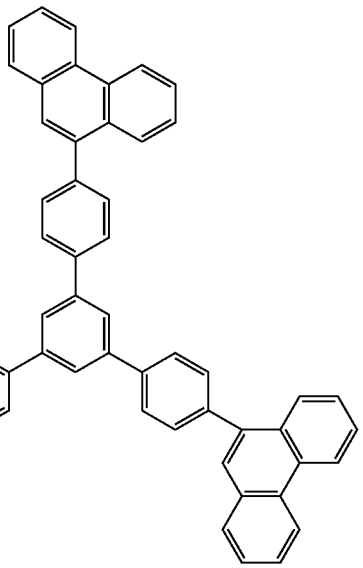
(1-10)
(1-8)
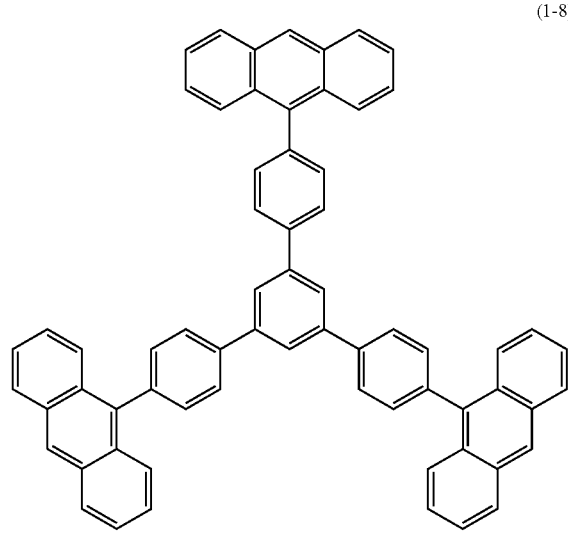
(1-11)

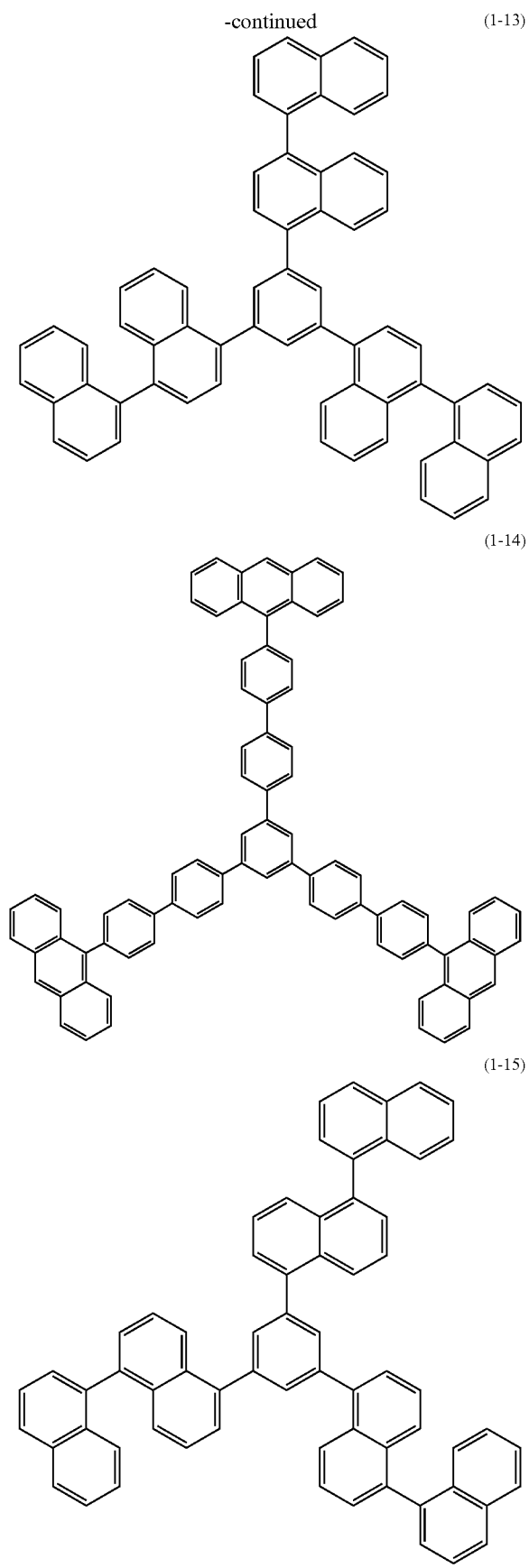
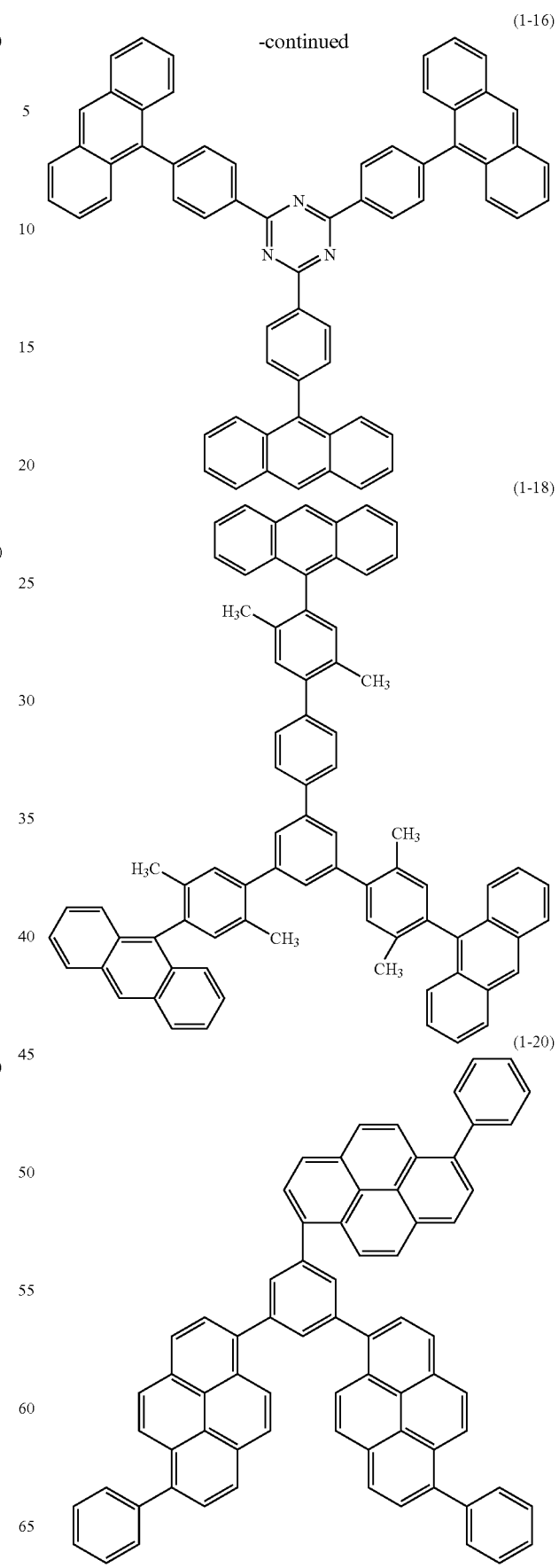

-continued
(1-21)
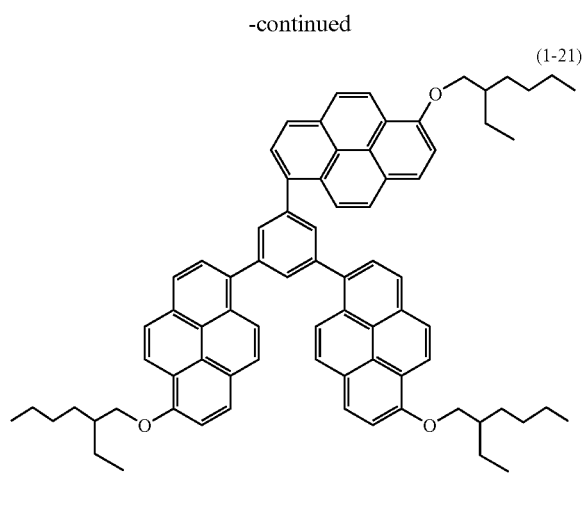
(1-24)
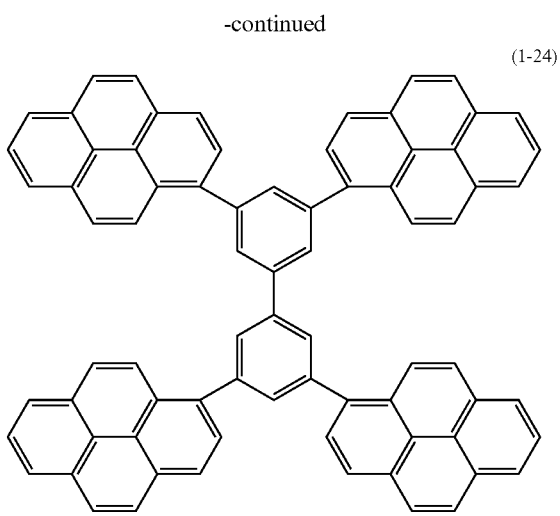
(1-22)
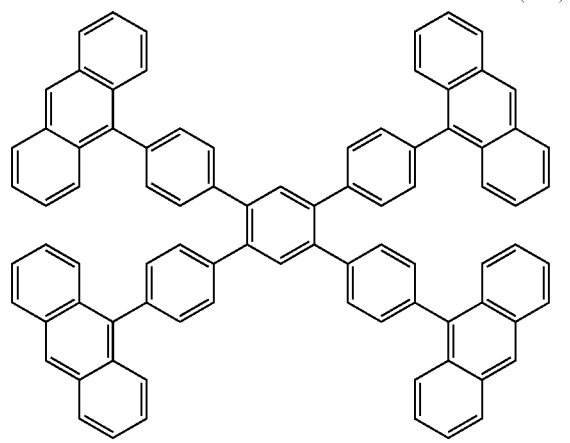
(1-25)
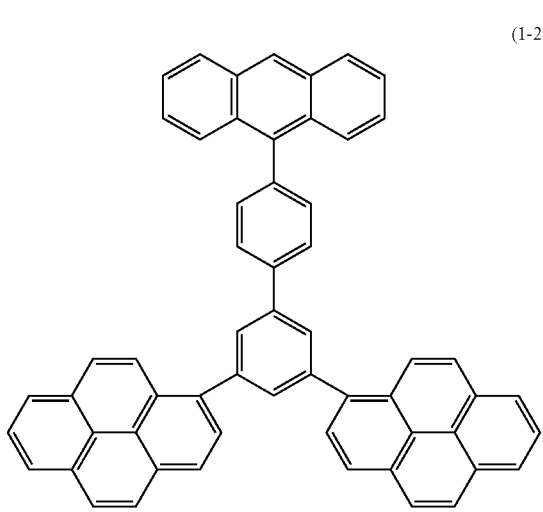
(1-23)
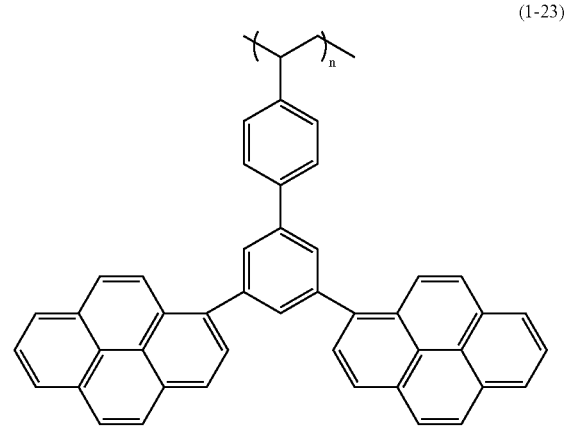
Molecular Weight Mw (on polystylene basis): 4,200
(1-26)
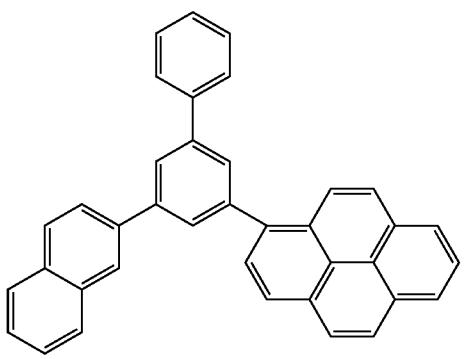

-continued
(1-27)
(1-28)
(1-29)
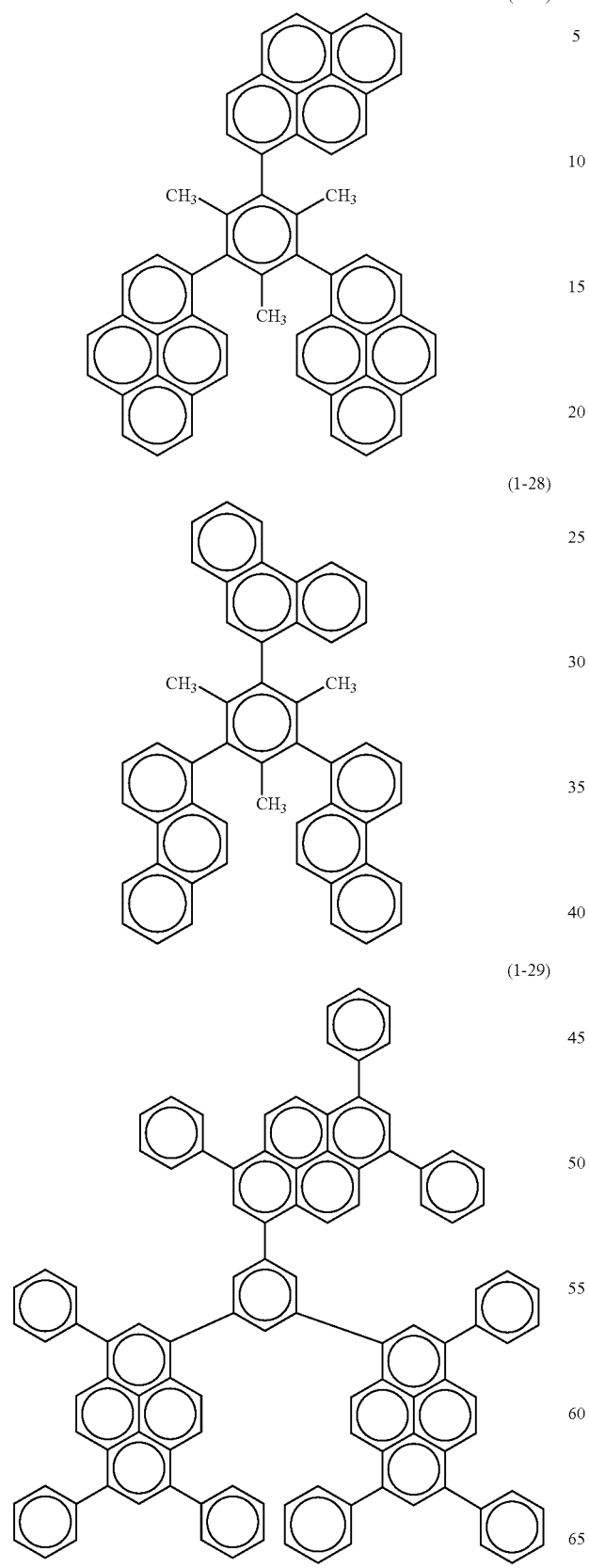
-continued
(1-30)
(1-31)
(1-32)
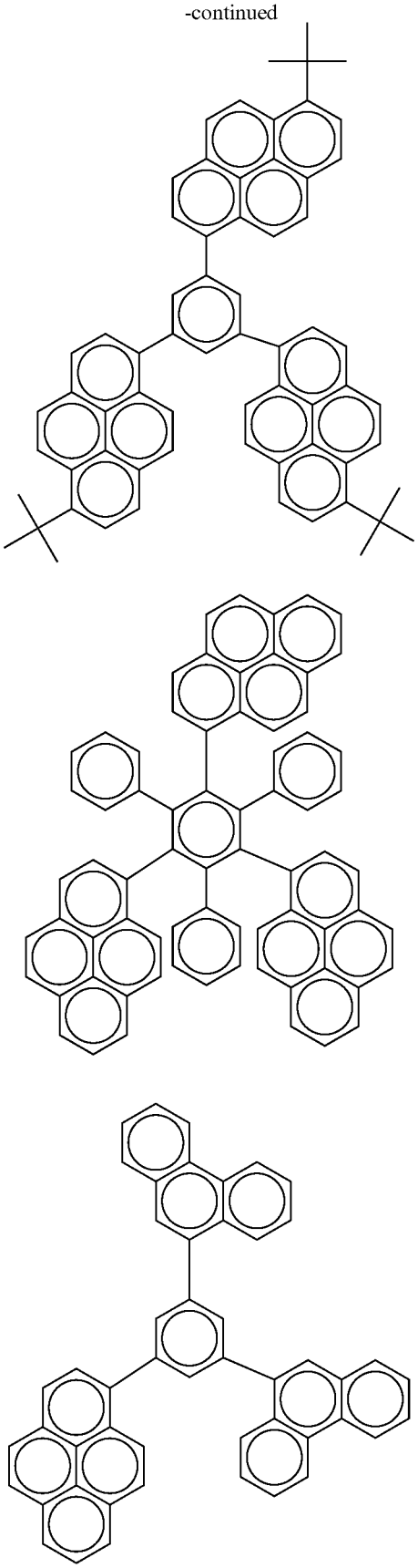

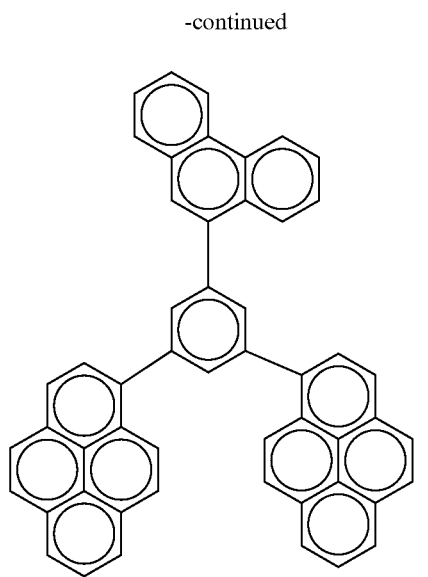
(1-33)
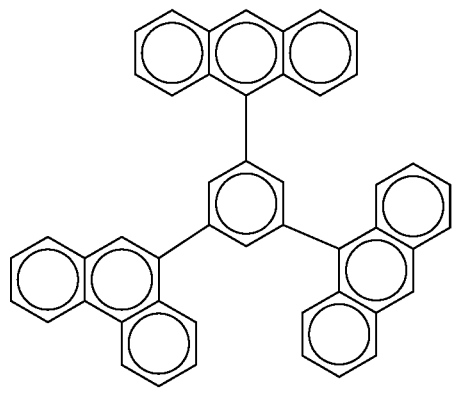
(1-36)
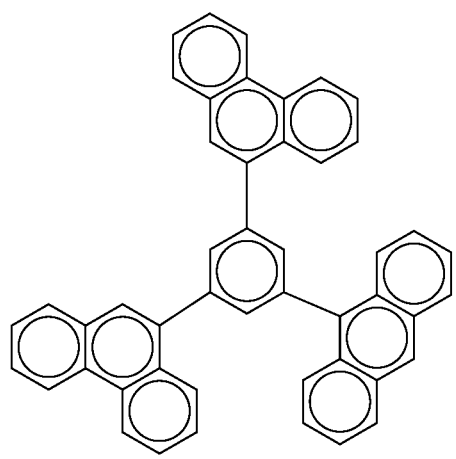
(1-34)
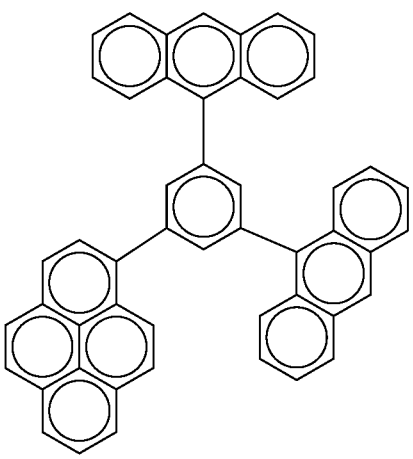
(1-37)
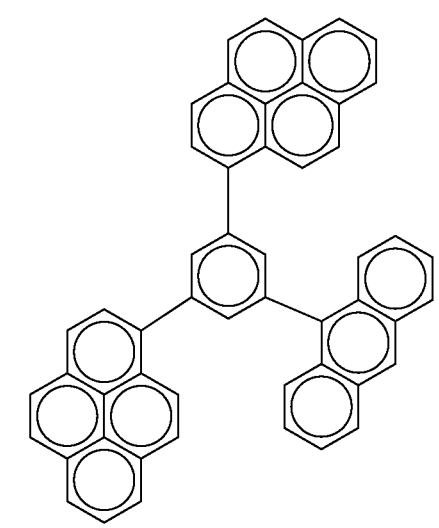
(1-35)
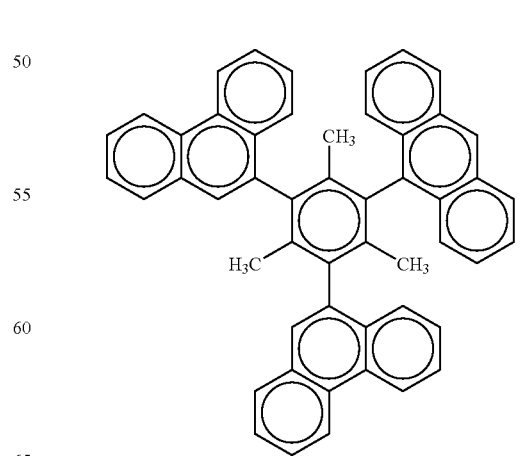
(1-38)

(1-39)
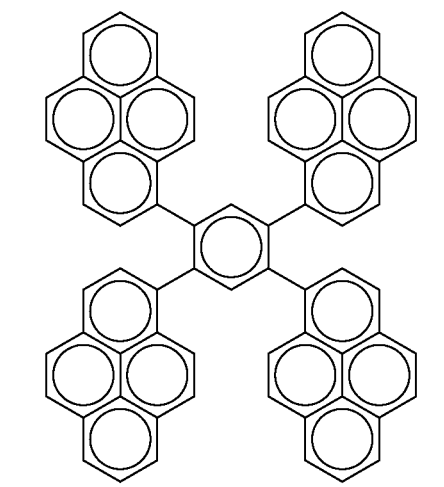

(1-40)
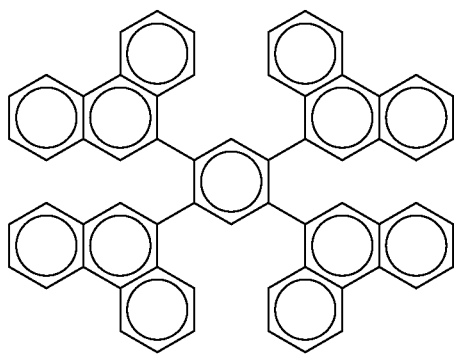

(1-41)
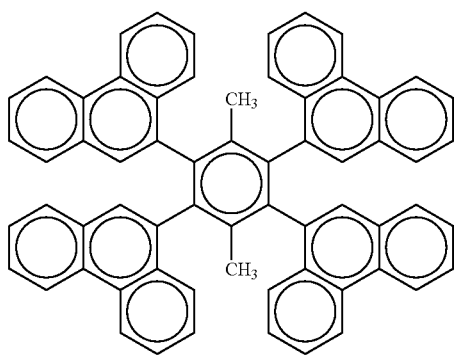

(1-42)
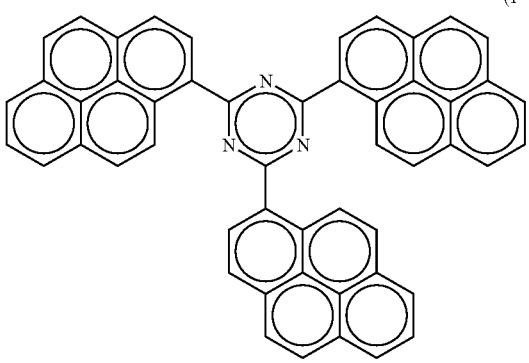

(1-43)
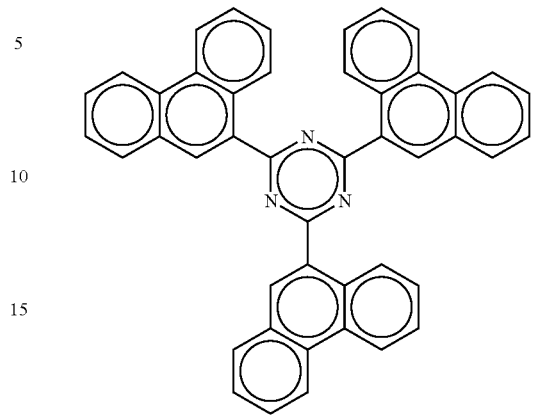

(1-44)
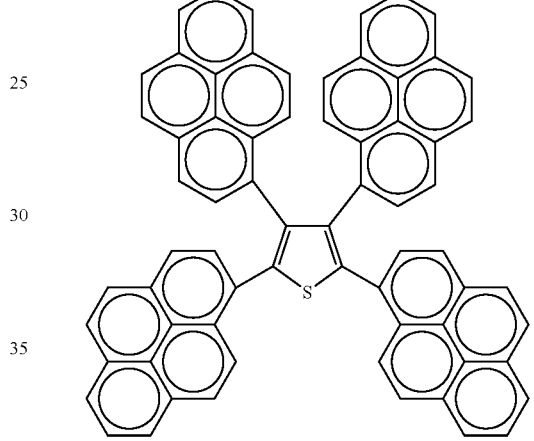

In the second place, methods of synthesizing the present compounds are described below.

The present compounds can be synthesized utilizing reactions for forming bonds between aromatic carbons. For the bond formation can be adopted the methods described, e.g., in *Organic Synthesis Reaction Guide*, pp. 617–643, John Wiley & Sons, Inc., and *Comprehensive Organic Transformation*, pp. 5–103, VCH Co., Ltd. Of these known methods, the synthesis methods of forming carbon-carbon bonds in the presence of palladium catalysts are preferable. Further, it is advantageous to synthesize the intended compounds by reacting boric acid derivatives with aryl halide derivatives in the presence of palladium catalysts.

Examples of such boric acid derivatives include substituted or unsubstituted arylboric acid derivatives (such as 1,4-phenyldiboric acid, 4,4'-biphenyldiboric acid, pyreneboric acid derivative, phenanthreneboric acid derivative) and substituted or unsubstituted heteroarylboric acid derivatives (such as pyridyldiboric acid).

The halogen atoms of aryl halide derivatives are preferably chlorine, bromine or iodine atoms, particularly preferably bromine atoms.

The foregoing reactions have no particular restrictions as to palladium catalysts. Examples of palladium catalysts usable therein include palladium tetrakistriphenylphosphine, palladium carbon, palladium acetate and palladium dichloride (dppf) (dppf: 1,1'-bisdiphenylphosphinoferrocene).

Ligands, such as triphenylphosphine, may be added simultaneously with those palladium catalysts.

In the reactions, it is preferable to use bases. The bases used are not particularly restricted in their kinds, but any of amines, such as sodium carbonate, sodium acetate and triethylamine, can be used. Also, the bases are not particularly restricted in their amounts used. However, the suitable amounts of bases used are from 0.1 to 20 equivalents, preferably from 1 to 10 equivalents, to the boric acid (ester) moiety.

In the reactions, it is also preferably to use solvents. Examples of solvents used, though they are not particularly restricted, include ethanol, water, ethylene glycol dimethyl ether, diethylene glycol dimethyl ether, dimethylformamide, toluene, tetrahydrofuran and mixtures of two or more thereof.

Then, light emitting devices comprising the present compounds are illustrated below.

It doesn't matter what system, operation method or utilization mode is adopted by the present light emitting devices so long as the present compounds are used in the devices. However, the devices utilizing luminescence from the present compounds and the devices utilizing the present compounds as electron transport materials are preferred as the present devices. The representatives of light emitting devices are organic EL (electroluminescence) devices.

The organic layers of the devices containing the present compounds are not particularly restricted in their formation methods, but they can be formed using, e.g., a resistance heating vapor deposition method, an electron beam method, a sputtering method, a molecular lamination method, a coating method or an inkjet method. Of these methods, the resistance heating vapor deposition method and the coating method are preferred in the characteristic and manufacturing aspects.

Every light emitting device relating to the invention is a device in which a luminescent layer or at least two thin layers of organic compounds, including a luminescent layer, are formed between a pair of electrodes, namely an anode and a cathode. The thin layers the device may have in addition to the luminescent layer are, e.g., a hole injection layer, a hole transport layer, an electron injection layer, an electron transport layer and a protective layer. Each of these layers may have another function. For forming each layer, various materials can be employed.

The anode supplies holes to a hole injection layer, a hole transport layer and a luminescent layer. As anode materials, metals, alloys, metal oxides, electrically conductive materials and mixtures thereof, preferably materials having a work function of at least 4 eV, can be used. Examples of such materials include conductive metal oxides, such as tin oxide, zinc oxide, indium oxide and indium tin oxide (ITO), metals such as gold, silver, chromium and nickel, mixtures or laminates of those metals and conductive metal oxides, inorganic conductive materials such as copper iodide and copper sulfide, organic conductive materials such as polyaniline, polythiophene and polypyrrole, and laminates of those materials and ITO. Of the materials recited above, the conductive metal oxides, especially ITO, are advantageous over the others from the viewpoints of productivity, conductivity and transparency. The suitable thickness of the anode, though can be selected depending on the anode material, is generally from 10 nm to 5 μm, preferably 50 nm to 1 μm, particularly preferably 100 nm to 500 nm.

In general the anode is used in the state of a layer formed on a soda lime glass, alkali-free glass or transparent resin substrate. In a case of using a glass substrate, alkali-free glass is preferred from the viewpoint of reduction in ions eluted from the glass. When soda glass is used as the substrate, it is desirable that the barrier coat, such as silica, be provided on the glass. The substrate thickness has no particular limitation so long as the substrate can ensure mechanical strength for the anode. For instance, the suitable thickness of a glass substrate is at least 0.2 mm, preferably at least 0.7 mm.

The methods suitable for making the anode vary with the material used. In the case of ITO, for example, the film formation can be carried out using an electron beam method, a sputtering method, a resistance heating vapor deposition method, a chemical reaction method (e.g., sol-gel method) or the method of coating a dispersion of indium tin oxide.

Washing and other treatments for the anode enable the device to get a reduction in operation potential and improve in light-emitting efficiency. In the case of an anode using ITO, it is effective for the anode to receive UV-ozone treatment or plasma treatment.

The cathode supplies electrons to an electron injection layer, an electron transport layer and a luminescent layer. In selecting the cathode, the adhesiveness to the electron injection, electron transport or luminescent layer adjacent to the cathode, the ionization potential and the stability are taken into consideration. As cathode materials, metals, alloys, metal halides, metal oxides, electrically conductive materials and mixtures thereof can be employed. Examples of such materials include alkali metals (e.g., Li, Na, K) and the fluorides thereof, alkaline earth metals (e.g., Mg, Ca) and the fluorides thereof, gold, silver, lead, aluminum, Na—K alloy or mixtures of two or more of these metals, Li—Al alloy or mixture, Mg—Ag alloy or mixture, and rare earth metals (e.g., In, Yb). Of these materials, the materials having a work function of at most 4 eV are advantageous over the others. In particular, aluminum, Li—Al alloy or mixture and Mg—Ag alloy or mixture are preferably used. The cathode may take a single-layer or made up of the compound or mixture as recited above or a lamination structure comprising the compounds or/and mixtures as recited above. The suitable thickness of the cathode, though can be chosen depending on the cathode material, is generally from 10 nm to 5 μm, preferably 50 nm to 1 μm, particularly preferably 100 nm to 1 μm.

In forming the cathode, various known methods, such as an electron beam method, a sputtering method, a resistance heating vapor deposition method and a coating method, can be adopted. The metals as recited above may be evaporated independently, or two or more thereof may be evaporated simultaneously. Further, it is possible to evaporate a plurality of metals at the same time to form an alloy electrode, or to evaporate the previously prepared alloy.

It is advantageous to the light emitting device that both anode and cathode have low sheet resistance, specifically several hundreds Ω/□ at the highest.

Any material can be used as a material for a luminescent layer so far as it can form a layer having a function of receiving both hole injection from the anode, the hole injection layer or the hole transport layer and electron injection from the cathode, the electron injection layer or the electron transport layer when the electric field is applied thereto, a function of permitting the charges injected therein to move and a function of enabling the emission of light by providing a place for recombining the holes and the electrons. Furthermore, the material for luminescent layer may emit a light from singlet exciton or triplet exciton.

Example of such a material include benzoxazole derivatives, benzimidazole derivatives, benzothiazole derivatives, styrylbenzene derivatives, polyphenyl derivatives, diphenylbutadiene derivatives, tetraphenylbutadiene derivatives, naphthalimide derivatives, coumarin derivatives, perylene derivatives, perinone derivatives, oxadiazole derivatives, aldazine derivatives, pyraridine derivatives, cyclopentadiene derivatives, bisstyrylanthracene derivatives, quinacridone derivatives, pyrrolopyridine derivatives, thiadiazolopyridine derivatives, styrylamine derivatives, aromatic dimethylidyne derivatives, various metal complexes represented by metal or rare earth complexes of 8-quinolinol derivatives, polymeric compounds such as polythiophene, polyphenylene and polyphenylenevinylene, organic silane derivatives, and the present compounds. Although the luminescent layer has no particular restrictions as to the thickness, the suitable thickness thereof is generally from 1 nm to 5 µm, preferably 5 nm to 1 µm, particularly preferably 10 nm to 500 nm.

As to the method of forming the luminescent layer, there is no particular restrictions, but various methods including a resistance heating vapor deposition method, an electron beam method, a sputtering method, a molecular lamination method, a coating method (e.g., a spin coating, cast coating or dip coating method), an ink jet method and an LB method can be adopted. Of these methods, resistance heating vapor deposition and coating methods are favored over the others.

The materials for the hole injection layer and the hole transport layer may be any materials so long as they have any one of the functions as an injector of holes from the anode, a transporter of holes and a barrier against electrons injected from the cathode. Examples of materials hitherto known to have one of such functions include carbazole derivatives, triazole derivatives, oxazole derivatives, oxadiazole derivatives, imidazole derivatives, polyarylalkane derivatives, pyrazoline derivatives, pyrazolone derivatives, phenylenediamine derivatives, arylamine derivatives, amino-substituted chalcone derivatives, styrylanthracene derivatives, fluorenone derivatives, hydrazone derivatives, stilbene derivatives, silazane derivatives, aromatic tertiary amine compounds, styrylamine compounds, aromatic dimethylidyne compounds, porphyrin compounds, polysilane compounds, conductive polymers and oligomers such as poly(N-vinylcarbazole) derivatives, aniline copolymers, thiophene oligomers and polythiophene, organic silane compounds, carbon membranes, and the present compounds. The suitable thickness of the hole injection layer and the hole transport layer each, though it has no particular limitation, is generally from 1 nm to 5 µm, preferably 5 nm to 1 µm, particularly preferably 10 nm to 500 nm. Each of the hole injection layer and the hole transport layer may have a single-layer structure constituted of one or more of the materials recited above or a multiple-layer structure made up of at least two layers having the same composition or different compositions.

As a method of forming the hole injection or transport layer, a vacuum evaporation method, an LB method, a method of coating a hole-injecting or transporting material in the form of a solution or dispersion in an appropriate solvent (using, e.g., a spin coating, cast coating or dip coating method) and an ink jet method can be adopted. When the coating method is adopted, the agent to constitute the layer may be dissolved or dispersed in a coating solvent, together with a resinous ingredient. Examples of such a resinous ingredient include polyvinyl chloride, polycarbonate, polystyrene, polymethyl methacrylate, polybutyl methacrylate, polyester, polysulfone, polyphenylene oxide, polybutadiene, poly(N-vinylcarbazole), hydrocarbon resin, ketone resin, phenoxy resin, polyamide, ethyl cellulose, polyvinyl acetate, ABS resin, polyurethane, melamine resin, unsaturated polyester resin, alkyd resin, epoxy resin and silicone resin.

The materials for the electron injection layer and the electron transport layer may be any materials so long as they have any one of the functions as an injector of the electrons from the cathode, a transporter of electrons and a barrier against holes injected from the anode. Examples of compounds known to have such a function include triazole derivatives, oxazole derivatives, oxadiazole derivatives, fluorenone derivatives, anthraquinodimethane derivatives, anthrone derivatives, diphenylquinone derivatives, thiopyran dioxide derivatives, carbodimide derivatives, fluorenylidenemethane derivatives, distyrylpyrazine derivatives, tetracarboxylic acid anhydrides of aromatic rings such as naphthalene and perylene, phthalocyanine derivatives, various metal complexes represented by metal complexes of 8-quinolinol derivatives, metallophthalocyanines and metal complexes having benzoxazole or benzothiazole ligands, organic silane derivatives and the present compounds. The suitable thickness of the electron injection layer and the electron transport layer each, though it has no particular limitation, is generally from 1 nm to 5 µm, preferably 5 nm to 1 µm, particularly preferably 10 nm to 500 nm. Each of the electron injection layer and the electron transport layer may have a single-layer structure constituted of one or more of the materials as recited above, or a multiple-layer structure made up of at least two layers having the same composition or different compositions.

As a method of forming the electron injection layer and the electron transport layer, a vacuum evaporation method, an LB method, a method of coating the electron-injecting or transporting material as recited above in the form of a solution or dispersion in an appropriate solvent (using, e.g., a spin coating, cast coating or dip coating method) and an ink jet method can be adopted. In the case of adopting a coating method, the electron-injecting or transporting agent can be dissolved or dispersed together with a resinous ingredient. Examples of a resinous ingredient usable therein include the same resins as employed for the hole injection and transport layers.

The materials for a protective layer may be any substances so long as they have a function capable of inhibiting the invasion of a device deterioration promoter, such as moisture or oxygen, into the device. Examples of such a substance include metals such as In, Sn, Pb, Au, Cu, Ag, Al, Ti and Ni, metal oxides such as MgO, SiO, $SiO_2$, $Al_2O_3$, GeO, NiO, CaO, BaO, $Fe_2O_3$, $Y_2O_3$ and $TiO_2$, metal fluorides such as $MgF_2$, LiF, $AlF_3$ and $CaF_2$, polyethylene, polypropylene, polymethyl methacrylate, polyimide, polyurea, polytetrafluoroethylene, polychlorotrifluoroethylene, polydichlorodifluoroethylene, copolymer of chlorotrifluoroethylene and dichlorodifluoroethylene, copolymers prepared by polymerizing a mixture of tetrafluoroethylene and at least one comonomer, and fluorine-containing copolymers having cyclic structures on the main chain, a water-absorbing substance having a water absorption rate of at least 1%, and a moisture proof substance having a water absorption rate of at most 0.1%.

The protective layer also has no particular restriction as to the formation method, but any of a vacuum evaporation method, a sputtering method, a reactive sputtering method, a molecular beam epitaxy (MBE) method, a cluster ion beam method, an ion plating method, a plasma polymerization method (high frequency excitation ion plating method), a plasma chemical vapor deposition (CVD) method, a laser CVD method, a heat CVD method, a gas source CVD method and a coating method can be adopted for the formation thereof.

The present invention will now be illustrated in more detail by reference to the following examples. However, the invention should not be construed as being limited to these examples.

Synthesis of Compound (1-1)

To a mixture of 1.0 g of pyreneboric acid ester (a), 0.29 g of 1,3,5-tribromobenzene, 0.6 g of sodium carbonate, 0.05 g of triphenylphosphine and 0.05 g of palladium carbon, 20 ml of diethylene glycol dimethyl ether and 20 ml of water were added, followed by stirring under reflux. After 6 hours, the reaction solution was diluted with 200 ml of chloroform and 200 ml of water, and subjected to cerite filtration. The organic layer obtained was washed with 100 ml each of water for two times, dried over sodium sulfate, and then concentrated. The concentrate obtained was purified by column chromatography (chloroform), and further purified by re-crystallization (chloroform/methanol) to yield 0.5 g of Compound (1-1). A vacuum evaporation film of Compound (1-1) was formed, and the fluorescence thereof was measured. The fluorescence maximum wavelength ($\lambda$max) of this film was 480 nm. The glass transition (Tg) temperature of the compound was 164° C.

Reaction Scheme of Compound (1-1) Synthesis:

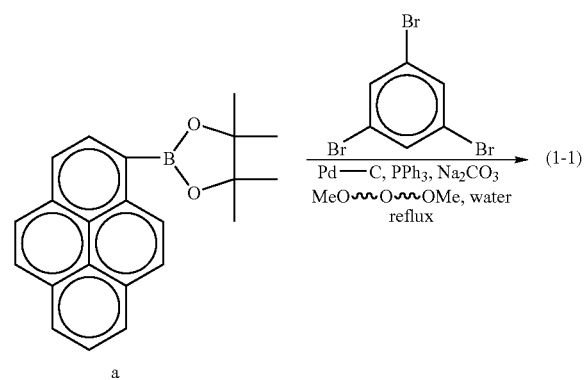

Synthesis of Compound (1-2)

To a mixture of 1.5 g of phenanthreneboric acid ester, 0.47 g of 1,3,5-tribromobenzene, 1.6 g of sodium carbonate, 0.07 g of triphenylphosphine and 0.07 g of palladium carbon, 0.30 ml of diethylene glycol dimethyl ether and 30 ml of water were added, followed by stirring under reflux. After 6 hours, the reaction solution was diluted with 200 ml of chloroform and 200 ml of 1-N hydrochloric acid water, and subjected to cerite filtration. The organic layer obtained was washed with 100 ml each of water for two times, dried over sodium sulfate, and then concentrated. The concentrate obtained was purified by column chromatography (hexane/ ethyl acetic acid system), and further purified by re-crystallization (chloroform/methanol) to yield 1.0 g of Compound (1-2). The structure of Compound (1-2) was confirmed with MS spectra. A vacuum evaporation film of Compound (1-2) was formed, and the fluorescence thereof was measured. The fluorescence maximum wavelength ($\lambda$max) of this film was 380 nm.

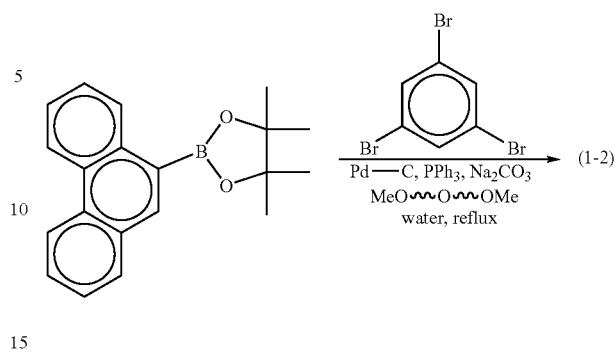

Synthesis of Compound (1-39)

To a mixture of 1.0 g of pyreneboric acid ester, 0.28 g of 1,2,4,5-tetrabromobenzene, 0.88 g of sodium carbonate, 0.05 g of triphenylphosphine and 0.05 g of palladium carbon, 30 ml of diethylene glycol dimethyl ether and 30 ml of water were added, followed by stirring under reflux. After 6 hours, the reaction solution was diluted with 200 ml of chloroform and 200 ml of 1-N hydrochloric acid water, and subjected to cerite filtration. The organic layer obtained was washed with 100 ml each of water for two times, dried over sodium sulfate, and then concentrated. The concentrate obtained was purified by column chromatography (chloroform), and further purified by re-crystallization (chloroform/ methanol) to yield 0.4 g of Compound (1-39). The structure of Compound (1-39) was confirmed with MS spectra.

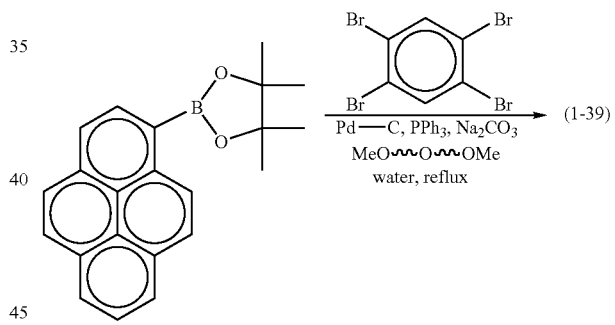

Synthesis of Compound (1-40)

To a mixture of 1.15 g of phenanthreneboric acid ester, 0.35 g of 1,2,4,5-tetrabromobenzene, 0.96 g of sodium carbonate, 0.07 g of triphenylphosphine and 0.07 g of palladium carbon, 30 ml of diethylene glycol dimethyl ether and 30 ml of water were added, followed by stirring under reflux. After 6 hours, the reaction solution was diluted with 200 ml of chloroform and 200 ml of 1-N hydrochloric acid water, and cooled to a room temperature and subjected to cerite filtration. The separated solid was dissolved in chloroform, and subjected to cerite filtration so as to remove palladium carbon. The, the solution was purified by column chromatography (chloroform), and further purified by re-crystallization (chloroform/methanol) to yield 0.5 g of Compound (1-40). The structure of Compound (1-40) was confirmed with MS spectra. A vacuum evaporation film of Compound (1-40) was formed, and the fluorescence thereof was measured. The fluorescence maximum wavelength ($\lambda$max) of this film was 440 nm.

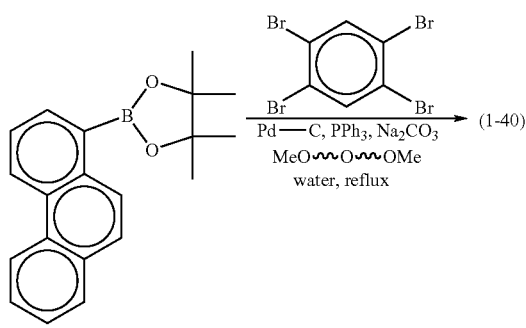

Synthesis of Compound (1-35)

250 ml of diethyl ether was added to 25 g of 1,3,5-tribromobenzene, and the mixture was cooled to −78° C. in a nitrogen stream. 52 ml of n-butyllithium (1.6M hexane solution) was dropped to the mixture, and then the temperature of the mixture was increased to a room temperature. 15.4 g of anthrone was separately added to the mixture, followed by stirring for three hours under flux while heating. To the solution cooled to a room temperature, 500 ml of ethyl acetate and 300 ml of 1-N hydrochloric acid water were added, and the organic layer was separated out. The organic layer was washed with 300 ml of saturated solution of salt, and then concentrated. The concentrate obtained was purified by column chromatography (chloroform) to obtain 1.5 g of Intermediate A (Compound A).

To a mixture of 0.84 g of pyreneboroic acid ester, 0.5 g of Compound A, 0.51 g of sodium carbonate, 0.05 g of triphenylphosphine and 0.05 g of palladium carbon, 30 ml of diethylene glycol dimethyl ether and 30 ml of water were added, followed by stirring under reflux. After 6 hours, the reaction solution was cooled to a room temperature and subjected to cerite filtration. The separated solid was dissolved in chloroform, and subjected to cerite filtration so as to remove palladium carbon. The, the solution was purified by column chromatography (chloroform), and further purified by re-crystallization (chloroform/methanol) to yield 0.3 g of Compound (1-35). The structure of Compound (1-35) was confirmed with MS spectra.

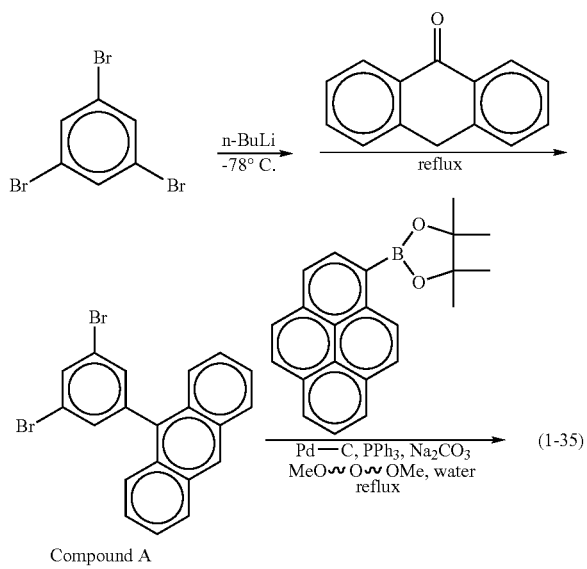

Compound A

Synthesis of Compound (1-37)

150 ml of diethyl ether was added to 10 g of 1,3,5-tribromobenzene, and the mixture was cooled to −78° C. in a nitrogen stream. 41.7 ml of n-butyllithium (1.6M hexane solution) was dropped to the mixture, and then the temperature of the mixture was increased to a room temperature. 13.0 g of anthrone was separately added to the mixture, followed by stirring for three hours under flux while heating. After removing dithyl ether by distillation, 200 ml of toluene and 0.1 g of paratoluene sulfonate were added to the solution, followed by stirring under reflux while heating. To the solution cooled to a room temperature, 300 ml of chloroform and 300 ml of water were added, and the organic layer was separated out and concentrated. The concentrate obtained was purified by column chromatography (chloroform), and crystallized (chloroform/hexane) to obtain 2.0 g of Intermediate B (Compound B).

To a mixture of 0.27 g of pyreneboroic acid ester, 0.4 g of Compound B, 0.17 g of sodium carbonate, 0.05 g of triphenylphosphine and 0.05 g of palladium carbon, 30 ml of diethylene glycol dimethyl ether and 30 ml of water were added, followed by stirring under reflux. After 6 hours, the reaction solution was cooled to a room temperature and subjected to cerite filtration. The separated solid was dissolved in chloroform, and subjected to cerite filtration so as to remove palladium carbon. The, the solution was purified by column chromatography (hexane/ethyl acetate system to chloroform system), and further purified by re-crystallization (chloroform/methanol) to yield 0.1 g of Compound (1-37). The structure of Compound (1-37) was confirmed with MS spectra.

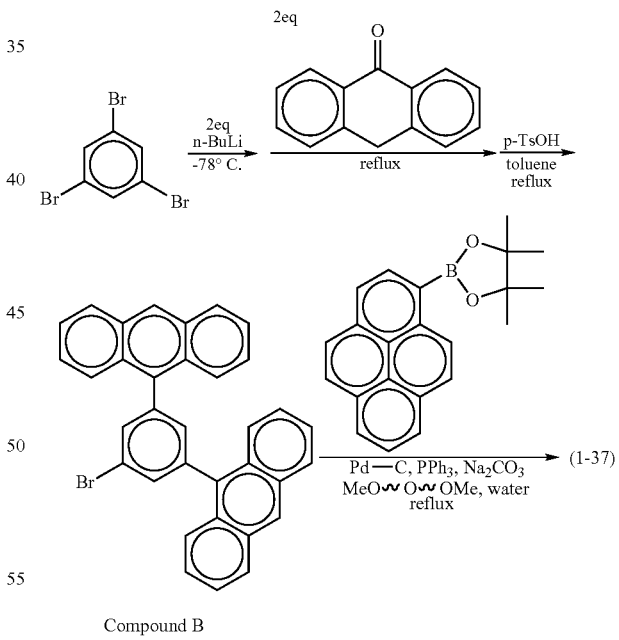

Compound B

COMPARATIVE EXAMPLE 1

A cleaned ITO substrate was placed in a vacuum evaporation apparatus. Onto this substrate, a 40 nm-thick (N,N-diphenyl-N,N'-di(α-naphthyl)benzidine (α-NPD) film, a 20 nm-thick film of distyryl compound (b) illustrated below and a 40 nm-thick film of azole compound (c) illustrated below were evaporated in order of description. On the thus formed lamination of organic compounds, a patterned mask (for adjusting each emission area to 4 mm×5 mm) was set and further, inside the vacuum evaporation apparatus, Mg and Ag were deposited simultaneously in a Mg/Ag ratio of 10/1 to form a metallic film having a thickness of 50 nm, followed by deposition of a 50 nm-thick Ag film.

The thus produced EL device was made to luminesce by applying thereto a DC constant voltage by means of a source measure unit, Model 2400, made by Toyo Technica Co., Ltd., and examined for luminance and wavelength of luminescence by using a luminometer BM-8 made by Topcon Co. and a spectrum analyzer PMA-11 made by Hamamatsu Photonics Co. respectively. As a result, it was found that the luminescence was bluish green, the chromaticity value thereof was (0.15, 0.20) and the maximum luminance was 1,130 cd/m². Further, the EL device was allowed to stand for one day in the atmosphere of nitrogen. As a result, white turbidity was observed at the film surface.

Compound (b)

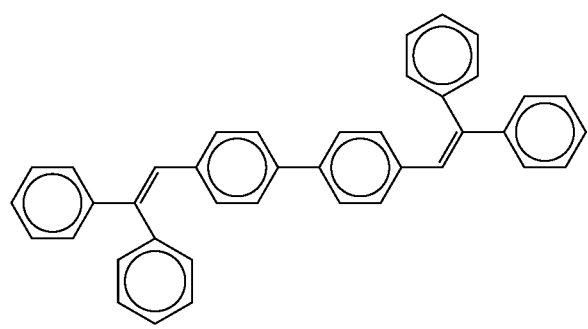

Compound (c)

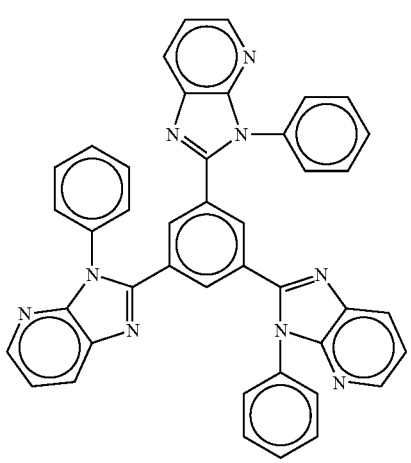

Compound (d)

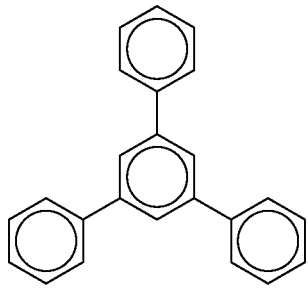

-continued

Compound (e)

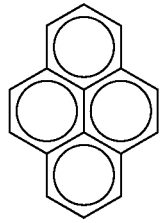

Compound (f)

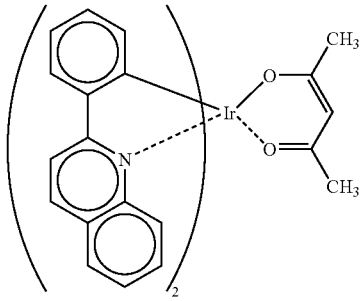

COMPARATIVE EXAMPLE 2

A light emitting device was produced in the same manner as in Comparative Example 1, except that Compound (d) was used in place of Compound (b). There appeared a milky turbidity in the lamination of organic compounds, and so it was impossible to evaluate the device.

COMPARATIVE EXAMPLE 3

A light emitting device was produced in the same manner as in Comparative Example 1, except that Compound (e) was used in place of Compound (b). There appeared a milky turbidity in the lamination of organic compounds, and so it was impossible to evaluate the device.

EXAMPLE 1

A light emitting device was produced in the same manner as in Comparative Example 1, except that the present Compound (1-1) was used in place of Compound (b), and evaluated using the same technique as in Comparative Example 1. As a result, it was found that the luminescence obtained was a bluish green luminescence having a chromaticity value of (0.17, 0.31) and had the maximum luminance of 12,740 cd/m². Even after the device was allowed to stand for one day in the atmosphere of nitrogen, the organic films were transparent.

EXAMPLE 2

A light emitting device was produced in the same manner as in Comparative Example 1, except that the present Compound (1-8) was used in place of Compound (b), and evaluated using the same technique as in Comparative Example 1. As a result, it was found that the luminescence obtained was a bluish green luminescence having a chromaticity value of (0.16, 0.20) and had the maximum luminance of 6,110 cd/m². Even after the device was allowed to stand for one day in the atmosphere of nitrogen, the organic films were transparent.

EXAMPLE 3

A cleaned ITO substrate was placed in a vacuum evaporation apparatus. Onto this substrate, a 40 nm-thick (N,N-diphenyl-N,N'-di(α-naphthyl)benzidine (α-NPD) film, a 20 nm-thick film of 50:1 mixture of distyryl compound (b) and the present Compound (1-1) and a 40 nm-thick film of azole compound (c) were evaporated in order of description. On the thus formed lamination of organic compounds, the metals were deposited in thin layers in the same manner as in Comparative Example 1. The thus produced light emitting device was evaluated using the same techniques as in Comparative Example 1. As a result, it was found that the luminescence obtained was a bluish green luminescence having a chromaticity value of (0.16, 0.20) and had the maximum luminance of 11,900 cd/m². Even after the device was allowed to stand for one day in the atmosphere of nitrogen, the organic films were transparent.

EXAMPLE 4

Polyvinylcarbazole in an amount of 40 mg, 12 mg of p-t-butylphenyl-biphenyl-1,2,4-oxadiazole (PBD) and 1 g of the present Compound (1-21) were dissolved in 3 ml of dichloroethane, and spin-coated on a cleaned substrate (2,000 r.p.m., 5 sec). On this coating, the electrode was deposited in the same manner as Comparative Example 1. The thus produced light emitting device was evaluated using the same techniques as in Comparative Example 1. As a result, it was found that the luminescence obtained was a bluish green luminescence having a chromaticity value of (0.17, 0.20) and had the maximum luminance of 2,710 cd/m².

EXAMPLE 5

A light emitting device was produced in the same manner as in Comparative Example 1, except that the present Compound (1-27) was used in place of Compound (b). As a result, it was found that the luminescence obtained was a green luminescence having a chromaticity value of (0.16, 0.22) and had the maximum luminance of 6,170 cd/m². Even after the device was allowed to stand for one day in the atmosphere of nitrogen, the organic films were transparent.

EXAMPLE 6

A light emitting device was produced in the same manner as in Comparative Example 1, except that the present Compound (1-30) was used in place of Compound (b). As a result, it was found that the luminescence obtained was a green luminescence having a chromaticity value of (0.18, 0.18) and had the maximum luminance of 7,550 cd/m². Even after the device was allowed to stand for one day in the atmosphere of nitrogen, the organic films were transparent.

EXAMPLE 7

A light emitting device was produced in the same manner as in Comparative Example 1, except that the present Compound (1-35) was used in place of Compound (b). As a result, it was found that the luminescence obtained was a bluish green luminescence having a chromaticity value of (0.20, 0.28) and had the maximum luminance of 3,980 cd/m². Even after the device was allowed to stand for one day in the atmosphere of nitrogen, the organic films were transparent.

EXAMPLE 8

A light emitting device was produced in the same manner as in Comparative Example 1, except that the present Compound (1-34) was used in place of Compound (b). As a result, it was found that the luminescence obtained was a green luminescence having a chromaticity value of (0.19, 0.22) and had the maximum luminance of 2,710 cd/m². Even after the device was allowed to stand for one day in the atmosphere of nitrogen, the organic films were transparent.

EXAMPLE 9

A light emitting device was produced in the same manner as in Comparative Example 1, except that the present Compound (1-40) was used in place of Compound (b). As a result, it was found that the luminescence obtained was a green luminescence having a chromaticity value of (0.18, 0.18) and had the maximum luminance of 3,240 cd/m². Even after the device was allowed to stand for one day in the atmosphere of nitrogen, the organic films were transparent.

EXAMPLE 10

A cleaned ITO substrate was placed in a vacuum evaporation apparatus. Onto this substrate, a 40 nm-thick (N,N-diphenyl-N,N'-di(α-naphthyl)benzidine (α-NPD) film, a 20 nm-thick film of 10:1 mixture of Compound (1-2) and Compound (f) and a 40 nm-thick film of azole compound (c) were evaporated in order of description. On the thus formed lamination of organic compounds, the metals were deposited in thin layers in the same manner as in Comparative Example 1. The thus produced light emitting device was evaluated using the same techniques as in Comparative Example 1. As a result, it was found that the luminescence obtained was a red luminescence having a chromaticity value of (0.60, 0.39) and had the maximum luminance of 18,700 cd/m². The external quantum efficiency was 12.0%.

Light emitting devices containing other compounds according to the invention were produced and evaluated in the same manner as described above. Thereby, it was confirmed that the present compounds had high capabilities (luminance, durability and film formability) as a light emitting device material.

The present compounds are usable as an organic EL material, and besides, they can be used for a medical purpose and also as brightening agents, photographic materials, UV absorbents, laser dyes, color filter dyes and color conversion filters.

What is claimed is:

1. A light emitting device comprising at least one organic layer including a light emitting layer between a pair of electrodes, wherein said at least one organic layer comprises at least one compound represented by formula (1):

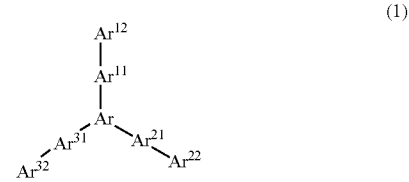

(1)

wherein Ar represents a heteroarene-triyl which can be substituted by a substituent group, and $Ar^{11}$, $Ar^{21}$ and $Ar^{31}$ each represents an arylene group provided that at least one of $Ar^{11}$, $Ar^{21}$ and $Ar^{31}$ each independently represents a fused arylene group, wherein the at least one of $Ar^{11}$, $Ar^{21}$ and $Ar^{31}$ each represents a phenanthrenylene group, a pyrenylene group, a fluorenylene group, a chrysenylene group or a triphenylene group and $Ar^{21}$, $Ar^{22}$ and $Ar^{32}$ each represents a substituent group.

2. The light emitting device of claim 1, wherein the fused arylene group is a fused arylene group having at least four rings.

3. The light emitting device of claim 2, wherein $Ar^{11}$, $Ar^{21}$ and $Ar^{31}$ each represents the fused arylene group having at least four rings.

4. A light emitting device comprising at least one organic layer including a light emitting layer between a pair of electrodes, wherein said at least one organic layer comprises at least one compound represented by formula (1):

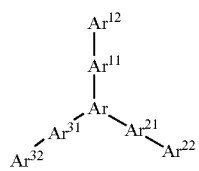

(1)

wherein Ar represents a heteroarene-triyl which can be substituted by a substituent group, and $Ar^{11}$, $Ar^{21}$ and $Ar^{31}$ each represents an arylene group, provided that at least one of $Ar^{11}$, $Ar^{21}$ $Ar^{31}$ is a fused arylene group, wherein the at least one of $Ar^{11}$, $Ar^{21}$ and $Ar^{31}$ each represents a phenanthrenylene group, a pyrenylene group, a fluorenylene group, a chrysenylene group or a triphenylene group and wherein $Ar^{12}$, $Ar^{22}$ and $Ar^{32}$ each represents a fused aryl group.

5. The light emitting device of claim 4, wherein $Ar^{11}$, $Ar^{21}$ and $Ar^{31}$ each represents a fused arylene group.

6. A light emitting device comprising at least one organic layer including a light emitting layer between a pair of electrodes, wherein said at least one organic layer comprises at least one compound represented by formula (1):

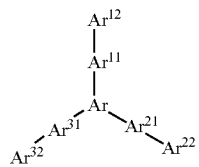

(1)

wherein Ar represents a heteroarene-triyl which can be substituted by a substituent group, and $Ar^{11}$, $Ar^{21}$ and $Ar^{31}$ each represents an arylene group, provided that at least one of $Ar^{11}$, $Ar^{21}$ and $Ar^{31}$ is a fused arylene group, and wherein $Ar^{12}$, $Ar^{22}$ and $Ar^{32}$ each represents a phenanthrenyl group or a fused aryl group having at least four rings.

7. The light emitting device of claim 6, wherein $Ar^{12}$, $Ar^{22}$ and $Ar^{32}$ each represents a fused aryl group having at least four rings.

8. The light emitting device of claim 7, wherein the fused aryl group having at least four rings is a pyrenyl group, a perylenyl group, a chrysenyl group or a triphenyl group.

9. A light emitting device comprising at least one organic layer including a light emitting layer between a pair of electrodes, wherein said at least one organic layer comprises at least one compound represented by formula (1):

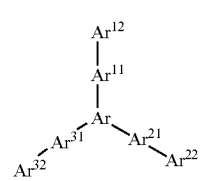

(1)

wherein Ar represents a heteroarene-triyl which can be substituted by a substituent group, $Ar^{11}$, $Ar^{21}$ and $Ar^{31}$ each represents an arylene group, provided that at least one of $Ar^{11}$, $Ar^{21}$ $Ar^{31}$, is a fused arylene group, and $Ar^{12}$, $Ar^{22}$ and $Ar^{32}$ each represents a pyrenyl group.

10. A light emitting device comprising at least one organic layer including a light emitting layer between a pair of electrodes, wherein said at least one organic layer comprises at least one compound represented by formula (1):

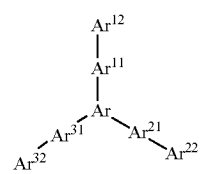

(1)

wherein Ar represents a pyridine-triyl, a pyrazine-triyl, a quinoline-triyl or a quinoxaline-triyl group, each of which can be substituted by a substituent group, and $Ar^{11}$, $Ar^{21}$ and $Ar^{31}$ each represents an arylene group provided that at least one of $Ar^{11}$, $Ar^{21}$ and $Ar^{31}$ each independently represents a fused arylene group, and $Ar^{12}$, $Ar^{22}$ and $Ar^{32}$ each represents a substituent group.

11. A light emitting device comprising at least one organic layer including a light emitting layer between a pair of electrodes, wherein said at least one organic layer comprises at least one compound represented by formula (1):

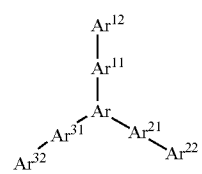

(1)

wherein Ar represents a heteroarene-triyl which can be substituted by a substituent group, $Ar^{11}$, $Ar^{21}$ and $Ar^{31}$ each represents an arylene group which is a phenanthrenylene group or a fused arylene group having at least four rings, and $Ar^{12}$, $Ar^{22}$ and $Ar^{32}$ each represents a phenanthrenyl group or a fused aryl group having at least four rings.

12. A light emitting device comprising at least one organic layer including a light emitting layer between a pair of electrodes, wherein said at least one organic layer comprises at least one compound represented by formula (1):

(1)

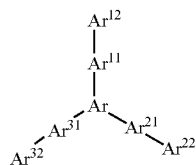

wherein Ar represents a heteroarene-triyl which can be substituted by a substituent group, and $Ar^{11}$, $Ar^{21}$ and $Ar^{31}$ each represents an arylene group which is a phenanthrenylene group or a fused arylene group having at least four rings, and $Ar^{12}$, $Ar^{22}$ and $Ar^{32}$ each represents a fused aryl group having at least four rings.

13. The light emitting device of claim 12, wherein the fused aryl group having at least four rings represented by $Ar^{12}$, $Ar^{22}$ and $Ar^{32}$ is a pyrenyl group, a perylenyl group, a chrysenyl group or a triphenyl group.

14. A light emitting device comprising at least one organic layer including a light emitting layer between a pair of electrodes, wherein said at least one organic layer comprises at least one compound represented by formula (1):

(1)

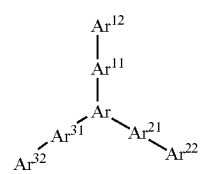

wherein Ar represents a heteroarene-triyl which can be substituted by a substituent group, and $Ar^{11}$, $Ar^{21}$ and $Ar^{31}$ each represents an arylene group which is a phenanthrenylene group or a fused arylene group having at least four rings, and $Ar^{12}$, $Ar^{22}$ and $Ar^{32}$ each represents a pyrenyl group.

* * * * *